(12) United States Patent
Cesaretti et al.

(10) Patent No.: US 8,680,846 B2
(45) Date of Patent: Mar. 25, 2014

(54) CIRCUITS AND METHODS FOR SELF-CALIBRATING OR SELF-TESTING A MAGNETIC FIELD SENSOR

(75) Inventors: Juan Manuel Cesaretti, Ciudad de Buenos Aires (AR); Gerardo Monreal, Pilar Buenos Aires (AR)

(73) Assignee: Allegro Microsystems, LLC, Worcester, MA (US)

( * ) Notice: Subject to any disclaimer, the term of this patent is extended or adjusted under 35 U.S.C. 154(b) by 261 days.

(21) Appl. No.: 13/095,371

(22) Filed: Apr. 27, 2011

(65) Prior Publication Data

US 2012/0274314 A1  Nov. 1, 2012

(51) Int. Cl.
*G01R 35/00* (2006.01)
(52) U.S. Cl.
USPC ........... 324/202; 324/251; 324/260; 702/117; 702/183
(58) Field of Classification Search
USPC ................... 324/202, 251, 260; 702/117, 183
See application file for complete search history.

(56) References Cited

U.S. PATENT DOCUMENTS

| | | | |
|---|---|---|---|
| 4,236,832 A | 12/1980 | Komatsu et al. | |
| 4,438,347 A | 3/1984 | Gehring | |
| 4,752,733 A | 6/1988 | Petr et al. | |
| 4,758,943 A | 7/1988 | Aström et al. | |
| 4,760,285 A | 7/1988 | Nelson | |
| 4,823,075 A | 4/1989 | Alley | |
| 4,833,406 A | 5/1989 | Foster | |
| 4,970,411 A | 11/1990 | Halg et al. | |
| 5,247,278 A | 9/1993 | Pant et al. | |
| 5,329,416 A | 7/1994 | Ushiyama et al. | |
| 5,343,143 A | 8/1994 | Voisine et al. | |
| 5,412,255 A | 5/1995 | Wallrafen | |
| 5,424,558 A | 6/1995 | Borden et al. | |
| 5,469,058 A | 11/1995 | Dunnam | |
| 5,521,501 A | 5/1996 | Dettmann et al. | |
| 5,621,319 A | 4/1997 | Bilotti et al. | |
| 5,640,090 A | 6/1997 | Furuya et al. | |
| 5,844,140 A | 12/1998 | Seale | |
| 6,011,770 A | 1/2000 | Tan | |
| 6,351,506 B1 | 2/2002 | Lewicki | |
| 6,392,478 B1 | 5/2002 | Mulder et al. | |
| 6,436,748 B1 | 8/2002 | Forbes et al. | |
| 6,437,558 B2 | 8/2002 | Li et al. | |
| 6,853,178 B2 | 2/2005 | Hayat-Dawoodi | |

(Continued)

FOREIGN PATENT DOCUMENTS

| CN | 1501093 A | 6/2004 |
|---|---|---|
| CN | 200986484 Y | 12/2007 |

(Continued)

OTHER PUBLICATIONS

U.S. Appl. No. 13/743,451, filed Jan. 17, 2013, Friedrich et al.

(Continued)

*Primary Examiner* — Arleen M Vazquez
*Assistant Examiner* — Alesa Allgood
(74) *Attorney, Agent, or Firm* — Daly, Crowley, Mofford & Durkee, LLP

(57) ABSTRACT

A magnetic field sensor includes a reference-field-sensing circuit channel that allows a calibration or a self-test of the circuitry of the magnetic field sensor. The magnetic field sensor can generate a reference magnetic field to which the magnetic field sensor is responsive.

62 Claims, 16 Drawing Sheets

(56) References Cited

U.S. PATENT DOCUMENTS

| | | | |
|---|---|---|---|
| 6,896,407 | B2 | 5/2005 | Nomiyama et al. |
| 6,917,321 | B1 | 7/2005 | Haurie et al. |
| 7,038,448 | B2 | 5/2006 | Schott et al. |
| 7,190,784 | B2 | 3/2007 | Li |
| 7,259,545 | B2 | 8/2007 | Stauth et al. |
| 7,292,095 | B2 | 11/2007 | Burt et al. |
| 7,319,319 | B2 | 1/2008 | Jones et al. |
| 7,323,870 | B2 | 1/2008 | Tatschl et al. |
| 7,325,175 | B2 | 1/2008 | Momtaz |
| 7,345,470 | B2 | 3/2008 | Suzuki |
| 7,425,821 | B2 | 9/2008 | Monreal et al. |
| 7,474,093 | B2 | 1/2009 | Ausserlechner |
| 7,518,354 | B2 | 4/2009 | Stauth et al. |
| 7,605,647 | B1 | 10/2009 | Romero et al. |
| 7,635,993 | B2 | 12/2009 | Boeve |
| 7,694,200 | B2 | 4/2010 | Forrest et al. |
| 7,701,208 | B2 | 4/2010 | Nishikawa |
| 7,729,675 | B2 | 6/2010 | Krone |
| 7,746,056 | B2 | 6/2010 | Stauth et al. |
| 7,746,065 | B2 * | 6/2010 | Pastre et al. ............... 324/202 |
| 7,764,118 | B2 | 7/2010 | Kusuda et al. |
| 7,769,110 | B2 | 8/2010 | Momtaz |
| 7,800,389 | B2 | 9/2010 | Friedrich et al. |
| 7,923,996 | B2 | 4/2011 | Doogue et al. |
| 7,936,144 | B2 | 5/2011 | Vig et al. |
| 7,961,823 | B2 | 6/2011 | Kolze et al. |
| 7,990,209 | B2 | 8/2011 | Romero |
| 8,030,918 | B2 | 10/2011 | Doogue et al. |
| 8,128,549 | B2 | 3/2012 | Testani et al. |
| 8,134,358 | B2 | 3/2012 | Charlier et al. |
| 8,203,329 | B2 | 6/2012 | Hohe et al. |
| 8,447,556 | B2 | 5/2013 | Friedrich et al. |
| 2002/0084923 | A1 | 7/2002 | Li |
| 2003/0038675 | A1 | 2/2003 | Gailus et al. |
| 2003/0102909 | A1 | 6/2003 | Motz |
| 2006/0202692 | A1 | 9/2006 | Tatschl et al. |
| 2007/0110199 | A1 | 5/2007 | Momtaz et al. |
| 2007/0247141 | A1 | 10/2007 | Pastre et al. |
| 2007/0285089 | A1 | 12/2007 | Ibuki et al. |
| 2008/0094055 | A1 | 4/2008 | Monreal et al. |
| 2008/0137784 | A1 | 6/2008 | Krone |
| 2008/0238410 | A1 | 10/2008 | Charlier et al. |
| 2009/0001964 | A1 | 1/2009 | Strzalkowski et al. |
| 2009/0001972 | A1 | 1/2009 | Fernandez et al. |
| 2009/0085706 | A1 | 4/2009 | Baarman et al. |
| 2009/0212765 | A1 | 8/2009 | Doogue et al. |
| 2010/0211347 | A1 | 8/2010 | Friedrich et al. |
| 2011/0018533 | A1 * | 1/2011 | Cesaretti et al. ............... 324/251 |
| 2011/0048102 | A1 | 3/2011 | Fernandez et al. |
| 2011/0298448 | A1 | 12/2011 | Foletto et al. |
| 2012/0274314 | A1 | 11/2012 | Cesaretti et al. |
| 2012/0313635 | A1 | 12/2012 | Daubert |
| 2013/0093412 | A1 | 4/2013 | Anelli et al. |

FOREIGN PATENT DOCUMENTS

| | | |
|---|---|---|
| DE | 195 39 458 A1 | 4/1997 |
| DE | 196 06 826 A1 | 8/1997 |
| DE | 10 2005 047 413 A1 | 9/2006 |
| DE | 10 2006 037 226 A1 | 2/2008 |
| DE | 10 2007 041 230 B3 | 4/2009 |
| EP | 0 289 414 A2 | 11/1988 |
| EP | 0 289 414 A3 | 11/1988 |
| EP | 0 338 122 | 10/1989 |
| EP | 0 357 013 A2 | 3/1990 |
| EP | 0 357 013 A3 | 3/1990 |
| EP | 1 637 898 A1 | 3/2006 |
| EP | 1 679 524 A1 | 7/2006 |
| EP | 1 850 143 A1 | 10/2007 |
| GB | 2 276 727 A | 10/1994 |
| JP | SHO 61-48777 | 3/1966 |
| JP | 03-248611 | 11/1991 |
| JP | 2004-177228 A | 6/2004 |
| JP | 2006-123012 A | 5/2006 |
| JP | 2008-513762 A | 5/2008 |
| JP | 2011-052036 A | 3/2011 |
| WO | WO 96/02849 A1 | 2/1996 |
| WO | WO 2004/072672 | 8/2004 |
| WO | WO 2006/056829 | 6/2006 |
| WO | WO 2007/138508 A1 | 12/2007 |
| WO | WO 2008/048379 A1 | 4/2008 |
| WO | WO 2009/108422 A2 | 9/2009 |
| WO | WO 2009/108422 A3 | 9/2009 |
| WO | WO 2010/096367 A1 | 8/2010 |
| WO | WO 2011/011479 | 1/2011 |

OTHER PUBLICATIONS

Letter to NTD Patent and Trademark Agency Ltd.; dated Dec. 11, 2012; with instructions to file Response to Official Action; for Chinese Pat. App. No. 200980106535.4; 3 pages.

Letter from NTD Patent and Trademark Agency Ltd.; dated Jan. 19, 2013; enclosing Response to Officiai Action; for Chinese Pat. App. No. 200980106535.4; 14 pages.

European Notice of Allowance; dated Jan. 4, 2013; for European Pat. App. No. 10 739 429.8; 7 pages.

PCT International Preliminary Report on Patentability and Written Opinion of the ISA; dated Feb. 2, 2012; for PCT Pat. App. No. PCT/US2010/042694; 11 sheets.

Final Office Action dated Feb. 12, 2013; for U.S. Appl. No. 12/840,324; 19 pages.

European Notice of Allowance; dated Jan. 4, 2013; for EP Pat. App. No. 10 739 429.8; 89 pages.

Ausserlechner et al.; "Compensation of the Piezo-Hall Effect in Integrated Hall Sensors on (100)-Si;" IEEE Sensors Journal, vol. 7, No. 11; Nov. 2007; ISBN: 1530-437X; pp. 1475-1482.

Ausserlechner et al.; "Drift of Magnetic Sensitivity of Small Hall Sensors Due to Moisture Absorbed by the IC-Package;" Proceedings of IEEE Sensors, 2004; vol. 1; Oct. 24, 2004; ISBN:0-7803-8692-2; pp. 455-458.

Ausserlechner; "Limits of Offset Cancellation by the Principle of Spinning Current Hall Probe;" Proceedings of IEEE Sensors; Oct. 2004; pp. 1117-1120.

Ausserlechner; "The piezo-Hall effect in n-silicon for arbitrary crystal orientation;" Proceedings of IEEE Sensors; vol. 3; Oct. 24, 2004; ISBN: 0-7803-8692-2; pp. 1149-1152.

Bahreyni, et al.; "A Resonant Micromachined Magnetic Field Sensor;" IEEE Sensors Journal; vol. 7, No. 9, Sep. 2007; pp. 1326-1334.

Barrettino, et al.; "CMOS-Based Monolithic Controllers for Smart Sensors Comprising Micromembranes and Microcantilevers;" IEEE Transactions on Circuits and Systems-I Regular Papers vol. 54, No. 1; Jan. 2007; pp. 141-152.

Baschirotto et al.; "Development and Analysis of PCB Vector 2-D Magnetic Field Sensor System for Electronic Compass;" IEEE Sensors Journal vol. 6, No. 2; Apr. 2006; pp. 365-371.

Bilotti et al.; "Monolithic Magnetic Hall Sensor Using Dynamic Quadrature Offset Cancellation;" IEEE Journal of Solid-State Circuits; vol. 32, Issue 6; Jun. 1997; pp. 829-836.

Demierre, et al.; "Reference Magnetic Actuator for Self-Calibration of a Very Small Hall Sensor Array;" Sensors and Actuators A97-98; Apr. 2002; pp. 39-46.

Frick, et al.; "CMOS Microsystem for AC Current Measurement with Galvanic Isolation;" IEEE Sensors Journal; vol. 3, No. 6; Dec. 2003; pp. 752-760.

Halg; "Piezo-Hall Coefficients of n-Type Silicon;" Journal of Applied Physics; vol. 64, No. 1; Jul. 1, 1988; pp. 276-282.

Hosticka; "CMOS Sensor Systems;" Sensors and Actuators A66; Apr. 1998; pp. 335-341.

Kanda et al.; "The Piezo-Hall Effect in n-Silicon;" 22$^{nd}$ International Conference on the Physics of Semiconductors; vol. 1, Jan. 1995; pp. 89-92.

Krammerer et al.: "A Hall effect sensors network insensitive to mechanical stress;" Proceedings of IEEE Sensors; vol. 3; Oct. 2004; pp. 1071-1074.

Mangnani et al.; "Mechanical Stress Measurement Electronics Based on Piezo-Resistive and Piezo-Hall Effects;" 9$^{th}$ International Conference on Electronics, Circuits and Systems 2002; vol. 1; SBN: 0-7803-7596-3; Dec. 2002; pp. 363-366.

(56) References Cited

OTHER PUBLICATIONS

Manic et al.; "Short and Long-Term Stability Problems of Hall Plates in Plastic Packages;" IEEE 38$^{th}$ Annual International Reliability Physics Symposium; Apr. 2000; pp. 225-230.

Manic; "Drift in Silicon Integrated Sensors and Circuits Due to the Thermo-Mechanical Stresses;" Lausanne, École Polytechnique Fédérale De Lausanne 2000; 176 pages.

Motz et al.; "An Integrated Magnetic Sensor with Two Continuous-Time ΔΣ-Converters and Stress Compensation Capability;" IEEE International Solid-State Circuits Conference; Digest of Technical Papers; Feb. 6, 2006; ISBN: 1-4244-0079-1; pp. 1151-1160.

Motz, et al.; "A Chopped Hall Sensor with Small Jitter and Programmable "True Power-On" Function;" IEEE Journal of Solid-State Circuits; vol. 40, No. 7; Jul. 2005; pp. 1533-1540.

Motz, et al.; "An Integrated Hall Sensor Platform Design for Position, Angle and Current Sensing;" IEEE Sensors 2006; Exco, Daegu, Korea / Oct. 22-25, 2006; pp. 1008-1011.

Munter; "A Low-offset Spinning-current Hall Plate;" Sensors and Actuators A21-A23; 1990; pp. 742-746.

Munter; "Electronic Circuitry for a Smart Spinning-current Hall Plate with Low Offset;" Sensors and Actuators A; Jun. 1991;.pp. 747-751.

Partin et al.; "Temperature Stable Hall Effect Sensors;" IEEE Sensors Journal, vol. 6, No. 1; Feb. 2006; pp. 106-110.

Pastre, et al.; "A Hall Sensor Analog Front End for Current Measurement with Continuous Gain Calibration;" IEEE Sensors Journal; vol. 7, No. 5; May 2007; pp. 860-867.

Pastre, et al.; "A Hall Sensor-Based Current Measurement Microsystem With Continuous Gain Calibration;" Research in Microelectronics and Electronics, IEEE vol. 2; Jul. 25, 2005; ISBN: 0-7803-9345-7; pp. 95-98.

Popovic; "Sensor Microsystems;" Proc. 20$^{th}$ International Conference on Microelectronics (MWIL 95); vol. 2, NIS, Serbia, 12-14; Sep. 1995; pp. 531-537.

Randhawa; "Monolithic Integrated Hall Devices in Silicon Circuits;" Microelectronics Journal; vol. 12, No. 6; Sep. 14-17, 1981; pp. 24-29.

Ruther et al.; "Integrated CMOS-Based Sensor Array for Mechanical Stress Mapping;" 5$^{th}$ IEEE Conference on Sensors, Oct. 2007; pp. 1131-1134.

Ruther et al.; "Theromagnetic Residual Offset in Integrated Hall Plates;" IEEE Sensors Journal; vol. 3, No. 6; Dec. 2003; pp. 693-699.

Sargent; "Switched-capacitor IC controls feedback loop;" EDN; Design Ideas; Feb. 17, 2000; pp. 154 and 156.

Schneider, et al.; "Temperature Calibration of CMOS Magnetic Vector Probe for Contactless Angle Measurement System;" IEDM; Dec. 1996; pp. 533-536.

Schott et al.; "Linearizing Integrated Hall Devices;" 1997 International Conference on Solid-State Sensors and Actuators, Jun. 16-19, 1997; pp. 393-396.

Schott, et al.; "CMOS Single-Chip Electronic Compass with Microcontroller;" IEEE Journal of Solid-State Circuits; vol. 42, No. 12; Dec. 2007; pp. 2923-2933.

Simon et al.; "Autocalibration of Silicon Hall Devices;" 8$^{th}$ International Conference on Solid-State Sensors and Actuators; vol. 2; Jun. 25, 1995; pp. 237-240.

Steiner et al; Offset Reduction in Hall Devices by Continuous Spinning Current Method; Sensors and Actuators A66; 1998; pp. 167-172.

Steiner: "Double-Hall Sensor with Self-Compensated Offset;" Electron Devices Meeting; IDSM '97 Technical Digest; Dec. 7-10, 1997; pp. 911-914.

Stellrecht et al.; Characterization of Hygroscopic Swelling Behavior of Mold Compounds and Plastic Packages; IEEE Transactions on Components and Packaging Technologies; vol. 27, No. 3; Sep. 2004; pp. 499-506.

Tian et al.; "Multiple Sensors on Pulsed Eddy-Current Detection for 3-D Subsurface Crack Assessment;" IEEE Sensors Journal, vol. 5, No. 1; Feb. 2005; pp. 90-96.

Trontelj et al; "CMOS Integrated Magnetic Field Source Used as a Reference in Magnetic Field Sensors on Common Substrate;" WEP 1-6; IMTC; May 1994; pp. 461-463.

Wu, et al.; "A Chopper Current-Feedback Instrumentation Amplifier with a 1mHz 1/f Noise Corner and an AC-Coupled Ripple-Reduction Loop;" IEEE International Solid-State Circuits Conference; Feb. 10, 2009; pp. 322-324.

Zou et al.; "Three-Dimensional Die Surface Stress Measurements in Delaminated and Non-Delaminated Plastic Packages;" 48$^{th}$ Electronic Components and Technology Conference; May 25, 1998; pp. 1223-1234.

PCT Search Report and Written Opinion of the ISA for PCT/US2009/031776 dated Oct. 23, 2009.

PCT International Preliminary Report on Patentability and Written Opinion mailed Sep. 10, 2010 for PCT/US2009/031776.

PCT Search Report and Written Opinion of the ISA for PCT/US2010/024256 dated Aug. 11, 2010.

PCT International Preliminary Report on Patentability and Written Opinion of the ISA for PCT Pat. App. No. PCT/US2010/024256; dated Sep. 1, 2011; 9 pages.

EP Official Communication; dated Feb. 23, 2012; for EP. Pat. App. No. 10739429.8; 2 pages.

Cessaretti et al; "Circuits and Methods Using Adjustable Feedback for Self-Calibrating or Self-Testing a Magnetic Field Sensor with an Adjustable Time Constraint;" U.S. Appl. No. 13/398,127; 85 pages.

U.S. Pat. No. 7,923,996; issued on Apr. 12, 2011; Part 1 of 5; 300 pages.

U.S. Pat. No. 7,923,996; issued on Apr. 12, 2011; Part 2 of 5; 300 pages.

U.S. Pat. No. 7,923,996; issued on Apr. 12, 2011; Part 3 of 5; 300 pages.

U.S. Pat. No. 7,923,996; issued on Apr. 12, 2011; Part 4 of 5; 300 pages.

U.S. Pat. No. 7,923,996; issued on Apr. 12, 2011; Part 5 of 5; 279 pages.

U.S. Pat. No. 8,030,918; issued on Oct. 4, 2011; 534pages.

U.S. Appl. No. 12/706,318; filed on Feb. 16, 2010; Part 1 of 9; 350 pages.

U.S. Appl. No. 12/706,318; filed on Feb. 16, 2010; Part 2 of 9; 350 pages.

U.S. Appl. No. 12/706,318; filed on Feb. 16, 2010; Part 3 of 9; 350 pages.

U.S. Appl. No. 12/706,318; filed on Feb. 16, 2010; Part 4 of 9; 200 pages.

U.S. Appl. No. 12/706,318; filed on Feb. 16, 2010; Part 5 of 9; 150 pages.

U.S. Appl. No. 12/706,318; filed on Feb. 16, 2010; Part 6 of 9; 350 pages.

U.S. Appl. No. 12/706,318; filed on Feb. 16, 2010; Part 7 of 9; 200 pages.

U.S. Appl. No. 12/706,318; filed on Feb. 16, 2010; Part 8 of 9; 150 pages.

U.S. Appl. No. 12/706,318; filed on Feb. 16, 2010; Part 9 of 9; 350 pages.

Cesaretti et al.; "Effect of Stress Due to Plastic Package Moisture Absorption in Hall Sensors;" IEEE Transactions on Magnets; vol. 45; No. 10; Oct. 2009; pp. 4482-4485.

PCT Search Report and Written Opinion of the ISA for PCT/US2010/042694 dated Sep. 27, 2010.

Response to Final Office Action; filed May 13, 2013; for U.S. Appl. No. 12/840,324; 12 pages.

Chinese Office Action dated Apr. 15, 2013; for CN Pat. App. No. 200980106535.4 4 pages.

Translation of Chinese Office Action; dated Apr. 15, 2013; for CN Pat. App. No. 200980106535.4 5 pages.

Foletto et al.; "Motion Sensor, Method, and Computer-Readable Storage Medium Providing a Motion Sensor That Can Rapidly Calibrate Gains;" U.S. Appl. No. 12/793,163, filed Jun. 3, 2010; 90 pages.

PCT Search Report and Written Opinion of the ISA for PCT Pat. App. No. PCT/US2012/032315; dated Jun. 22, 2012; 16 pages.

Office Action dated Jul. 6, 2012; for U.S. Appl. No. 12/706,318, filed Feb. 16, 2010; 24 pages.

(56) References Cited

OTHER PUBLICATIONS

Office Action dated Sep. 11, 2012 from U.S. Appl. No. 12/840,324; 30 pages.
Response to European Written Opinion; filed on Sep. 4, 2012; for EP Pat. App. No. 10739429.8; 11 pages.
U.S. Notice of Allowance; dated Dec. 10, 2012; for U.S. Appl. No. 12/706,318; 9 pages.
European Response to Written Opinion; dated Sep. 4, 2012; for European Pat. App. No. 10739429.8; 11 pages.
U.S. Response filed Dec. 11, 2012; to Office Action dated Sep. 11, 2012; for U.S. Appl. No. 12/840,324; 15 pages.
Translated Chinese Office Action dated Apr. 15, 2013; for CN Pat. App. No. 200980106565.4; 5 pages.
Chinese Office Action dated Apr. 15, 2013; for CN Pat. App. No. 200980106565.4; 4 pages.
European Decision to Grant a European Patent; dated Sep. 5, 2013; for European Pat. App. No. 10739429.8; 2 pages.
Blagojevic et al.; "FD SOI Hall Sensor Electronics Interfaces for Energy Measurement;" Microelectronics Journal 37; Sep. 2006; pp. 1576-1583.
Kayal et al.; "Automatic Calibration of Hall Sensor Microsystems;" Microelectronics Journal 37; Sep. 2006; pp. 1569-1575.
Office Action dated Jun. 12, 2013; for U.S. Appl. No. 13/743,451; 24 pages.
PCT Search Report and Written Opinion; dated May 27, 2013; for PCT Pat. App. No. PCT/US2013/021143; 13 pages.
Letter to NTD Patent and Trademark Agency; dated Jun. 19, 2013; for Chinese Pat. App. No. 200980106535.4; 11 pages.
Letter from NTD Patent and Trademark Agency; dated Jul. 11, 2013; for Chinese Pat. App. No. 200980106535.4; 1 page.
Chinese Response to Office Action; Jun. 27, 2013; for Chinese Pat. App. No. 200980106535.4; 12 pages.
European Search Report; dated Jul. 4, 2013; for EP Pat. App. No. 13169661.9; 11 pages.
Letter from Yuase & Hara; dated May 27, 2013; for JP Pat. App. No. 2010-547666; 2 pages.
Japanese Notice of Reasons for Rejection (English translation); dated Apr. 4, 2013; for JP Pat. App. No. 2010-547666; 4 pages.
Notice of Allowance; dated May 24, 2013; for U.S. Appl. No. 12/840,324; 12 pages.
Letter from Yuasa and Hara; dated Aug. 6, 2013; for Japanese Pat. App. No. 2012-521746; 6 pages.
Japanese Amendment; dated Jun. 12, 2013; for Japanese Pat. App. No. 2012-521746; 5 pages.
U.S. Appl. No. 13/969,702, filed Aug. 19, 2013, Cesaretti et al.
Corrected Notice of Allowance; dated Aug. 9, 2013; for U.S. Appl. No. 12/840,324; 6 pages.
Response filed on May 24, 2011; for Office Action dated Feb. 2, 2011; for U.S. Appl. No. 12/959,672; 8 pages.
Notice of Allowance; dated Feb. 11, 2011; for U.S. Appl. No. 12/037,393; 8 pages.
Office Action; dated Feb. 2, 2011; for U.S. Appl. No. 12/959,672; 13 pages.
Letter from NTD Patent & Trademark Agency Limited; dated Oct. 10, 2012; for Chinese Pat. App. No. 200980106535.4; 13 pages.
Chinese Office Action; dated Aug. 29, 2012; for Chinese Pat. App. No. 200980106535.4; 4 pages.
Chinese Office Action (Translated into English); dated Aug. 29, 2012; for Chinese Pat. App. No. 200980106535.4; 4 pages.
PCT International Preliminary Report on Patentability and Written Opinion of the ISA dated Nov. 7, 2013; for PCT Pat. App. No. PCT/US2012/032315; 13 pages.
Chinese Office Action dated Nov. 7, 2013 (w/English translation); for Chinese Pat. App. No. 200980106535.4; 9 pages.
Claims from Chinese Office Action dated Nov. 7, 2013 (w/English translation); for Chinese Pat. App. No. 200980106535.4; 8 pages.
Notice of Allowance dated Nov. 14, 2013; for U.S. Appl. No. 13/969,702; 26 pages.
Response filed Oct. 8, 2013; to Office Action dated Jun. 12, 2013; for U.S. Appl. No. 13/743,451; 12 pages.
Letter from Yuasa and Hara; dated Oct. 8, 2013; for Japanese Pat. App. No. 2010-547666; 2 pages.
Argument and Amendment (in Japanese); dated Jul. 3, 2013; for Japanese Pat. App. No. 2010-547666: 6 pages.
Claims for Argument and Amendment (in English); dated Jul. 3, 2013; for Japanese Pat. App. No. 2010-547666; 5 pages.
German Office Action; dated Sep. 23, 2013; for German Pat. App. No. 11 2010 000 848.5; 12 pages.
Notice of Allowance dated Dec. 24, 2013; for U.S. Appl. No. 13/743,451; 24 pages.
Japanese Notice of Reasons for Rejection (English translation) dated Nov. 26, 2013; for JP Pat. App. No. 2010-547666; 2 pages.

\* cited by examiner

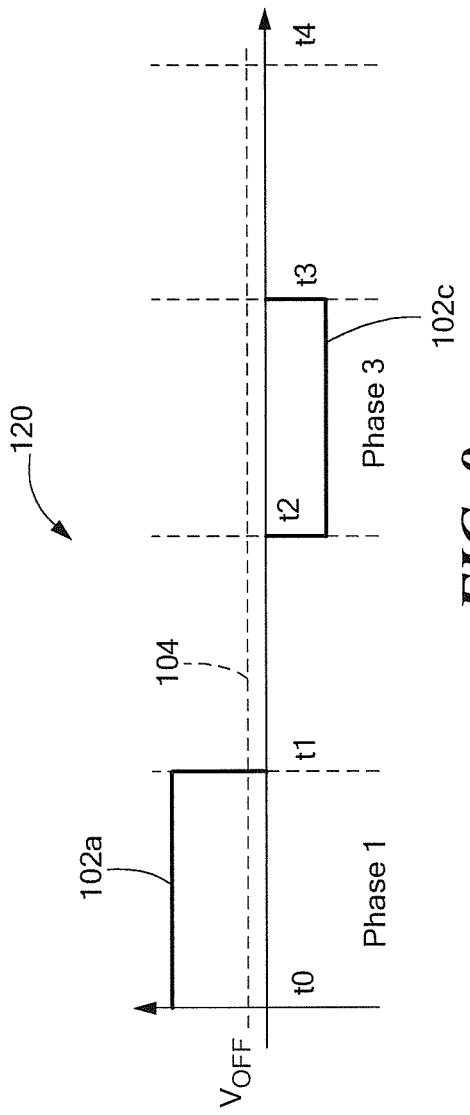
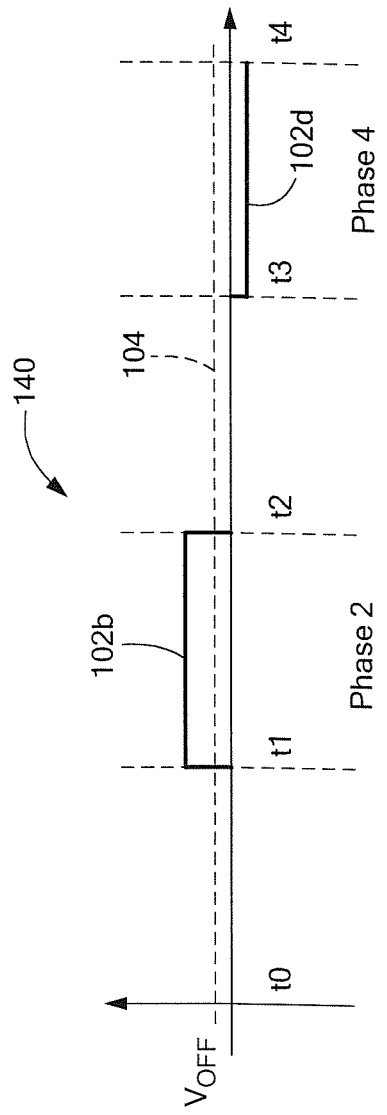
FIG. 9
FIG. 10

CIRCUITS AND METHODS FOR SELF-CALIBRATING OR SELF-TESTING A MAGNETIC FIELD SENSOR

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors and, more particularly, to magnetic field sensors having magnetic field sensing elements alternately coupled in a measured-field-sensing configuration and in a reference-field-sensing configuration.

BACKGROUND OF THE INVENTION

As is known, there are a variety of types of magnetic field sensing elements, including, but not limited to, Hall effect elements, magnetoresistance elements, and magnetotransistors. As is also known, there are different types of Hall effect elements, for example, planar Hall elements, vertical Hall elements, and circular Hall elements. As is also known, there are different types of magnetoresistance elements, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements.

Hall effect elements generate an output voltage proportional to a magnetic field. In contrast, magnetoresistance elements change resistance in proportion to a magnetic field. In a circuit, an electrical current can be directed through the magnetoresistance element, thereby generating a voltage output signal proportional to the magnetic field.

Magnetic field sensors, which use magnetic field sensing elements, are used in a variety of applications, including, but not limited to, a current sensor that senses a magnetic field generated by a current carried by a current-carrying conductor, a magnetic switch (also referred to herein as a proximity detector) that senses the proximity of a ferromagnetic or magnetic object, a rotation detector that senses passing ferromagnetic articles, for example, gear teeth, and a magnetic field sensor that senses a magnetic field density of a magnetic field. Particular magnetic field sensor arrangements are used as examples herein. However, the circuits and techniques described herein apply also to any magnetic field sensor.

As is known, some integrated circuits have internal built-in self-test (BIST) capabilities. A built-in self-test is a function that can verify all or a portion of the internal functionality of an integrated circuit. Some types of integrated circuits have built-in self-test circuits built directly onto the integrated circuit die. Typically, the built-in self-test is activated by external means, for example, a signal communicated from outside the integrated circuit to dedicated pins or ports on the integrated circuit. For example, an integrated circuit that has a memory portion can include a built-in self-test circuit, which can be activated by a self-test signal communicated from outside the integrated circuit. The built-in self-test circuit can test the memory portion of the integrated circuit in response to the self-test signal.

Conventional built-in self-test circuits used in magnetic field sensors tend not to test the magnetic field sensing element used in the magnetic field sensor. Conventional built-in self-test circuits also tend not to test all of the circuits with a magnetic field sensor.

Some magnetic field sensors employ self-calibration techniques, for example, by locally generating a calibration magnetic field with a coil or the like, measuring a signal resulting from the calibration magnetic field, and feeding back a signal related to the resulting signal to control a gain of the magnetic field sensor. Several self-calibration arrangements are shown and described in U.S. patent application Ser. No. 12/037,393, entitled "Magnetic Field Sensor With Automatic Sensitivity Adjustment," filed Feb. 26, 2008, and assigned to the assignee of the present invention. Also U.S. patent application Ser. No. 12/840,324, entitled "Circuits and Methods For Generating A Diagnostic Mode Of Operation In A Magnetic Field Sensor," filed Jul. 21, 2010, and assigned to the assignee of the present invention, teaches various arrangements of coils and conductors disposed proximate to magnetic field sensing elements and used to generate a self-test magnetic field. The above application also teaches various multiplexing arrangements. These applications, and all other patents and patent applications described herein, are incorporated by reference herein in their entirety.

Typically, calibration of the magnetic field sensor must be performed when the magnetic field sensor is not sensing a sensed magnetic field, i.e., when the magnetic field sensor is not operating in its regular sensing mode.

It would be desirable to provide built in self-test circuits and techniques in a magnetic field sensor that allow the self-test function to test a magnetic field sensing element used within the magnetic field sensor. It would also be desirable to provide built in self-test circuits and techniques in a magnetic field sensor that allow the self-test all of the circuits within the magnetic field sensor. It would also be desirable to be able to perform the self-test regardless of a magnitude of an external magnetic field.

In addition to the self-test function, it would be desirable to provide a gain adjustment (calibration) of the magnetic field sensor that can occur as the magnetic field sensor operates in normal operation.

SUMMARY OF THE INVENTION

The present invention can provides a gain adjustment (calibration) of the magnetic field sensor that can occur as the magnetic field sensor operates in normal operation.

The present invention can also provide built in self-test circuits and techniques in a magnetic field sensor that allow a self-test function to test a magnetic field sensing element used within the magnetic field sensor. The present invention can also provide built in self-test circuits and techniques in a magnetic field sensor that allow the self-test all of the circuits within the magnetic field sensor. The present invention can also provide an ability to perform the self-test regardless of a magnitude of an external magnetic field.

In accordance with one aspect of the present invention, a magnetic field sensor includes at least two magnetic field sensing elements. The magnetic field sensor also includes a first switching circuit coupled to the at least two magnetic field sensing elements. The switching circuit is configured to couple the at least two magnetic field sensing elements into a measured-field-sensing configuration and into a reference-field-sensing configuration. The first switching circuit is operable to switch back and forth alternately between the measured-field-sensing configuration and the referencefield-sensing configuration at a first switching rate to provide a magnetic field signal. The first switching circuit is configured to generate the magnetic field signal. The magnetic field signal includes a measured-magnetic-field-responsive signal portion responsive to a measured magnetic field when coupled in the measured-field-sensing configuration, and a reference-magnetic-field-responsive signal portion responsive to a reference magnetic field when coupled in the reference-field-sensing configuration.

In accordance with another aspect of the present invention, a method of generating a calibration or a self-test of a magnetic field sensor includes coupling at least two magnetic field sensing elements into a measured-field-sensing configuration. The method also includes coupling the at least two magnetic field sensing elements into a reference-field-sensing configuration. The method also includes switching back and forth alternately between the measured-field-sensing configuration and the reference-field-sensing configuration at a first switching rate to provide a magnetic field signal. The at least two magnetic field sensing elements are configured to generate a magnetic field signal. The magnetic field signal includes a measured-magnetic-field-responsive signal portion responsive to a measured magnetic field when coupled in the measured-field-sensing configuration, and a reference-magnetic-field-responsive signal portion responsive to a reference magnetic field when coupled in the reference-field-sensing configuration.

BRIEF DESCRIPTION OF THE DRAWINGS

The foregoing features of the invention, as well as the invention itself may be more fully understood from the following detailed description of the drawings, in which:

FIG. 9 is a graph showing output signals from the two Hall elements of FIG. 7 showing signals only during the first and third phases corresponding to measured-field-sensing configurations of the two Hall elements;

FIG. 10 is a graph showing output signals from the two Hall elements of FIG. 7 showing signals only during the second and fourth phases corresponding to the reference-field-sensing configuration of the two Hall elements;

DETAILED DESCRIPTION OF THE INVENTION

Figure 1:
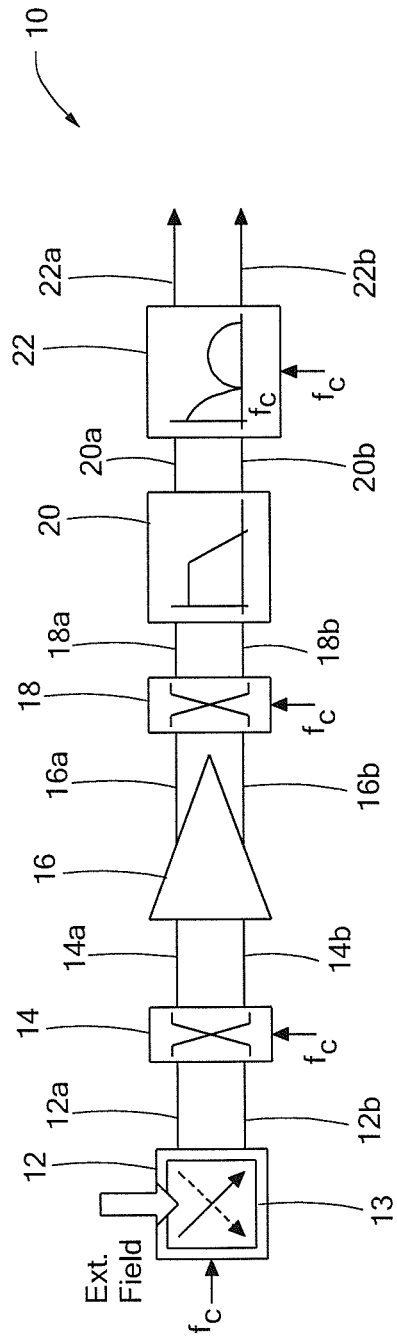
FIG. 1 is a block diagram of a prior art magnetic field sensor, that has a chopped (or switched) Hall effect element, and an associated switching circuit.

Before describing the present invention, some introductory concepts and terminology are explained. As used herein, the term "magnetic field sensing element" is used to describe a variety of types of electronic elements that can sense a magnetic field. The magnetic field sensing elements can be, but are not limited to, Hall effect elements, magnetoresistance elements, or magnetotransistors. As is known, there are different types of Hall effect elements, for example, planar Hall elements, vertical Hall elements, and circular Hall elements. As is also known, there are different types of magnetoresistance elements, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements.

As is known, some of the above-described magnetic field sensing elements tends to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, most, but not all, types of magnetoresistance elements tend to have axes of maximum sensitivity parallel to the substrate and most, but not all, types of Hall elements tend to have axes of sensitivity perpendicular to a substrate.

As used herein, the term "magnetic field sensor" is used to describe a circuit that includes a magnetic field sensing element. Magnetic field sensors are used in a variety of applications, including, but not limited to, a current sensor that senses a magnetic field generated by a current carried by a current-carrying conductor, a magnetic switch (also referred to herein as a proximity detector) that senses the proximity of a ferromagnetic or magnetic object, a rotation detector that senses passing ferromagnetic articles, for example, gear teeth, and a magnetic field sensor (e.g., a linear magnetic field sensor) that senses a magnetic field density of a magnetic field. Linear magnetic field sensors are used as examples herein. However, the circuits and techniques described herein apply also to any magnetic field sensor capable of detecting a magnetic field.

As used herein, the term "magnetic field signal" is used to describe any circuit signal that results from a magnetic field experienced by a magnetic field sensing element.

Reference-field-sensing configuration modes of operation described below are generally used to adjust a gain or a sensitivity of a magnetic field sensor. However, the reference-field-sensing configuration can also be used to provide a self-test of the magnetic field sensor. Namely, if no output signal is generated during a reference field mode of operation (or, in the case of a linear magnetic field sensor, the output signal is too low or too high), the magnetic field sensor is deemed to have failed. Thus, as used herein, the term "reference" is used to encompass sensitivity measurement (self-test) and calibration.

Referring to FIG. 1, a prior art magnetic field sensor 10 includes a Hall effect element 13 coupled within a switching circuit 12. The switching circuit 12 is configured to generate a differential output signal 12a, 12b responsive to an external magnetic field. Many signals described below can be differential signals, however, the term differential is not used in all instances. In other embodiments, some or all of the signals are single ended signals.

The switching circuit 12 is more fully described below in conjunction with FIGS. 2-2C. Let it suffice here to say that the switching circuit 12 switches a drive signal (not shown) to the Hall effect element 12 with a clock at a frequency of $f_c$.

The magnetic field sensor 10 also includes a switching circuit 14 coupled to receive the signal 12a, 12b and configured to generate a chopped signal 14a, 14b. The switching circuit 14 is also switched with the clock at a frequency of $f_c$. Combined operation of the switching circuit 12 with the switching circuit 14 is described more fully below in conjunction with FIGS. 3-3C.

An amplifier 16 is coupled to receive the chopped signal 14a, 14b and configured to generate an amplified signal 16a, 16b. A switching circuit 18 is coupled to receive the amplified signal 16a, 16b and configured to generate a demultiplexed signal 18a, 18b. The switching circuit 18 is clocked with the clock at the frequency, $f_c$. A low pass filter 20 is coupled to receive the demultiplexed signal 18a, 18b and configured to generate a filtered signal 20a, 20b. A sinx/x (sinc) filter 22 is coupled to receive the filtered signal 20a, 20b and configured to generate a filtered signal 22a, 22b, i.e., an output signal from the magnetic field sensor 10.

In some embodiments, the sinc filter 22 is a switched capacitor filter having a first notch at a frequency $f_c$. However, in other embodiments, the sinc filter 22 is generated digitally. In still other embodiments, the sinc filter 22 is an analog unclocked filter.

It will be understood that clock frequency provided to the sinc filter 22 can be at a frequency of $f_c$ as shown to provide the notch at the frequency $f_c$. However, it will also be understood that the sinc filter 22 can be designed to have the notch at the frequency $f_c$ but using a clock signal at a different frequency. In conjunction with figures below, the clock provided to the sinc filter 22 is described to be at the frequency $f_c$. However, it is the notch frequency at the frequency $f_c$ that is desired.

It will be understood that the magnetic field sensor output signal 22a, 22b is a linear signal proportional to a magnetic field experienced by the magnetic field sensing element 12 and that the magnetic field sensor 10 is a linear magnetic field sensor. However, in other embodiments, a comparator can receive the signal 22a, 22b, the magnetic fields sensor output signal thus generated by the comparator is a two-state signal, and the magnetic field sensor is a magnetic switch. It will also be understood that, in some embodiments, only one of the filters 20, 22 is used.

Operation of the magnetic field sensor of FIG. 1 is described below in conjunction with FIG. 1A.

Figure 1A:
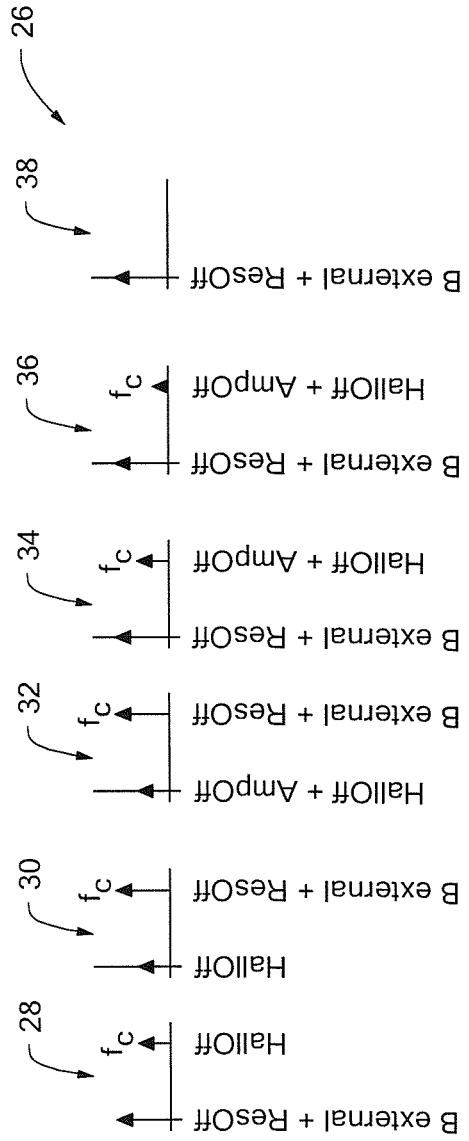
FIG. 1A is a series of graphs showing frequency spectrums at various points in the prior at magnetic field sensor of FIG. 1.

Referring now to FIG. 1A, graphs 26 each include a horizontal axis having units of frequency in arbitrary units and a vertical axis having units of power in arbitrary units.

A graph 28 is representative of the signal 12a, 12b, (i.e., frequency spectra of the signal 12a, 12b) and shows an external magnetic field signal, Bexternal, plus a residual offset signal, ResOff, appearing at a frequency, which can be a zero frequency indicative of a DC external magnetic field. A Hall effect offset signal, HallOff, is at a different frequency, according to a frequency of the clock, $f_c$. This effect is further described in conjunction with FIGS. 2-2C.

The Hall effect offset signal, HallOff, corresponds to a DC voltage error that would be present in the output signal 12a, 12b of the Hall effect element 13, but when the switching circuit 12 is not switching, i.e., when the current through the Hall effect elements 104, 106 is directed in one particular respective direction. As shown in the graph 28, the Hall effect offset signal, HallOff, is shifted to a higher frequency in the differential signal 12a, 12b by switching operation of the switching circuit 12 (and is shifted back to DC by operation of the switch circuit 14, as described below in conjunction with graph 30). The residual offset signal, ResOff, corresponds to a remaining offset signal that remains at DC in the differential signal 12a, 12b even when the switching circuit 12 is switching (and is shifted to a higher frequency by operation of the switching circuit 14, as described below in conjunction with graph 30).

A graph 30 is representative of the signal 14a, 14b, after chopping. The Hall offset signal, HallOff, is shifted to DC by operation of the switching circuit 14, and the signal Bexternal+ResOff is at the frequency $f_c$.

A graph 32 is representative of the signal 16a, 16b. In the graph 32, a DC offset of the amplifier 16 is added to the Hall offset signal at DC resulting in a signal HallOff+AmpOff at DC.

A graph 34 is representative of the signal 18a, 18b, after the switching circuit 18. As can be seen, the signal Bexternal+ResOff is now at DC and the signal HallOff+AmpOff is now at the frequency, $f_c$.

A graph 36 is representative of the signals 20a, 20b after the filter 20. A break frequency of the filter 20 is selected to be below the frequency, $f_c$. The signal HallOff+AmpOff is reduced, as is desired.

A graph 38 is representative of the signal 22a, 22b, after the sinc filter 22. The notch of the sinc filter 22 is selected to be at the frequency, $f_c$, i.e., at a Nyquist frequency of the sinc filter 22. Only the external magnetic field signal (plus some residual offset) remains in the graph 38 and in the signal 22a, 22b. The Hall effect element offset (HallOff) has been removed.

Figure 2:
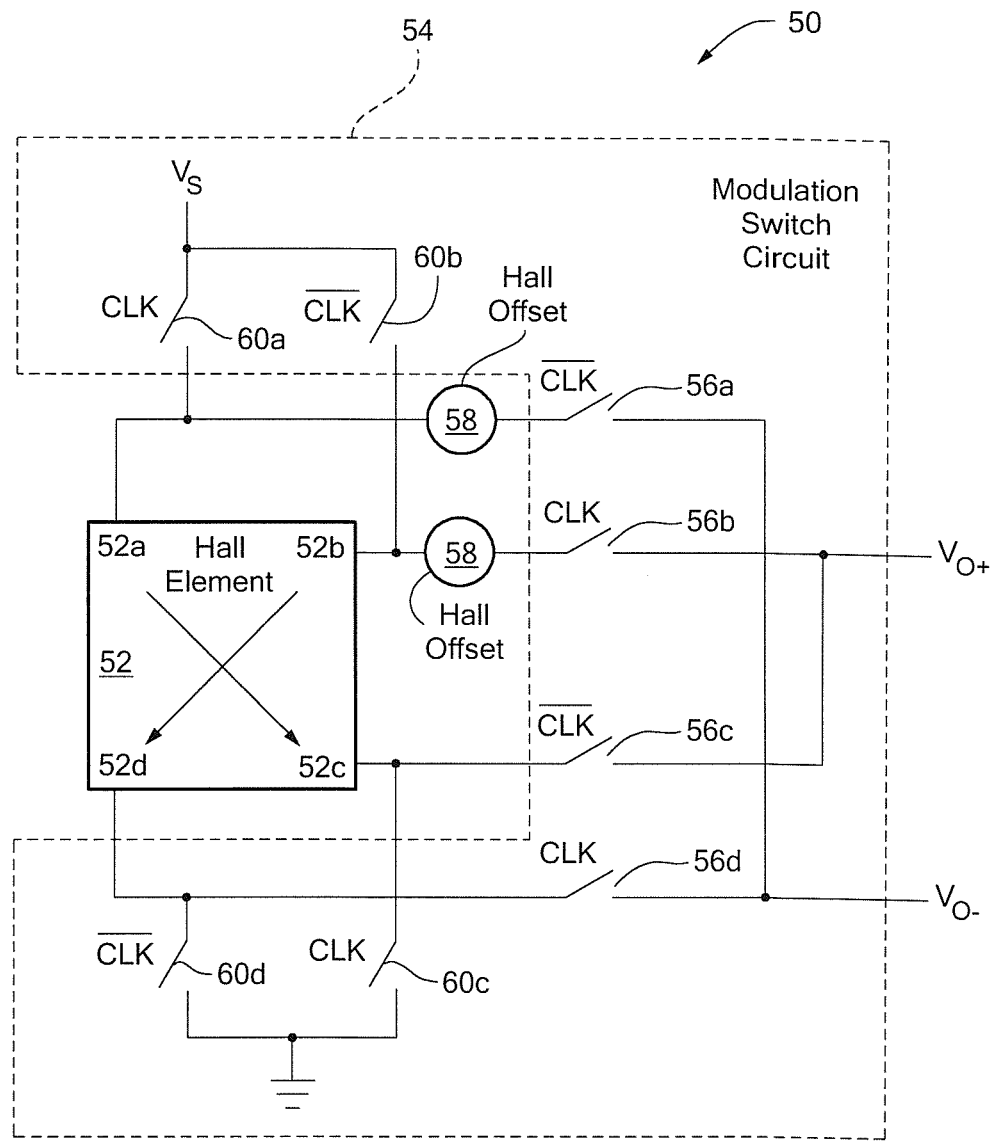
FIG. 2 is a block diagram showing a switched Hall element having a Hall effect element and having a switching circuit that can be used as the Hall effect element and the switching circuit of the magnetic field sensor of FIG. 1, and also as the Hall effect element and the switching circuit of magnetic field sensors below.
Figure 2A:
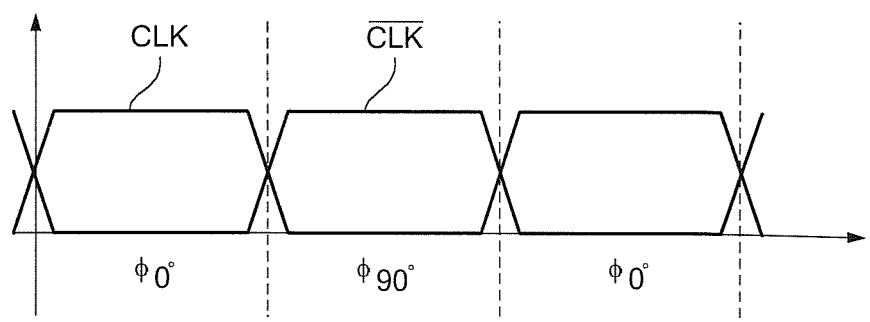
FIG. 2A is a graph showing clock signals for the switched Hall element of FIG. 2.
Figure 2B:
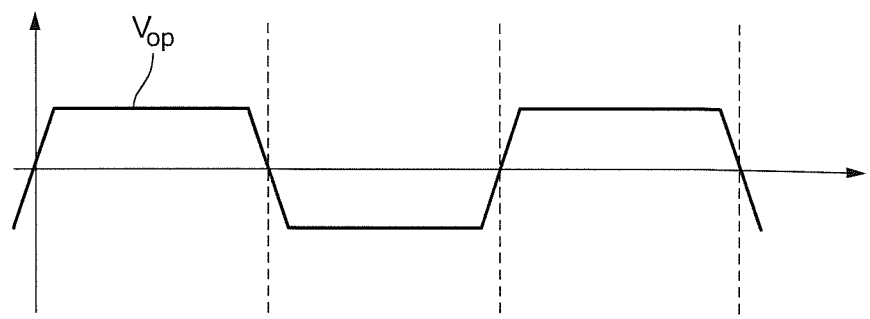
FIG. 2B is a graph showing a modulated offset component provided by the switched Hall element of FIG. 2.
Figure 2C:
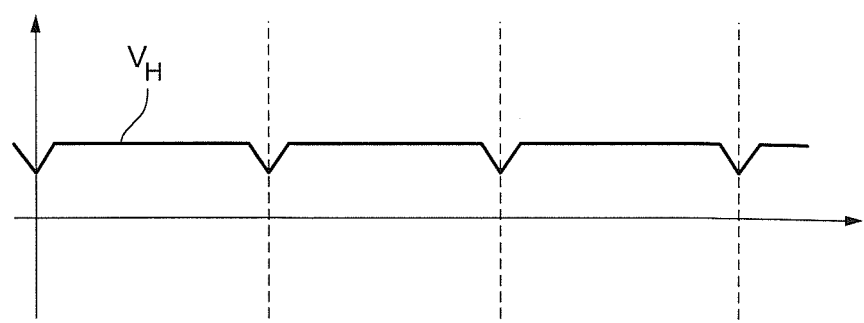
FIG. 2C is a graph showing an un-modulated magnetic field signal component provided by the switched Hall element of FIG. 2.

Referring now to FIGS. 2-2C, a switched Hall element 50 of a type that modulates a Hall offset component (e.g., 58) includes a Hall element (or Hall plate) 52 and a modulation circuit 54. The Hall element 52 includes four contacts 52a, 52b, 52c, and 52d, each coupled to a first terminal of a respective switch 56a, 56b, 56c, and 56d, as shown. Second terminals of switches 56b and 56c are coupled to provide a positive node of a switched Hall output signal, here labeled Vo+, and second terminals of switches 56a and 56d are coupled to provide a negative node of the switched Hall output signal, here labeled Vo−.

Additional switches 60a, 60b, 60c, and 60d are arranged to selectively couple the Hall contacts 52a, 52b, 52c, 52d to the supply voltage, Vs, and ground. More particularly, switches 56b, 56d, 60a, and 60c are controlled by a clock signal, CLK, and switches 56a, 56c, 60b, and 60d are controlled by a complementary clock signal, CLK/, as shown. The clock signals CLK and CLK/ have two states or phases, a $\phi_{0°}$ state and a $\phi_{90°}$ state, as shown in FIG. 2A.

In operation, during phase $100_{0°}$, current flows from the terminal 52a to the terminal 52c and the switched Hall output signal, Vo, is equal to $V_H+V_{op}$, where $V_{op}$ is the Hall element offset voltage or Hall offset component and $V_H$ is the magnetic field signal component. During the phase $100_{90°}$, current flows from the terminal 52b to the terminal 52d and the switched Hall output signal, Vo, is equal to $V_H-V_{op}$. Thus, the modulation circuit 54 modulates the Hall offset component, $V_{op}$, which is shown in FIG. 2B. The magnetic field signal component, $V_H$, remains substantially invariant, as shown in FIG. 2C.

Figure 3:
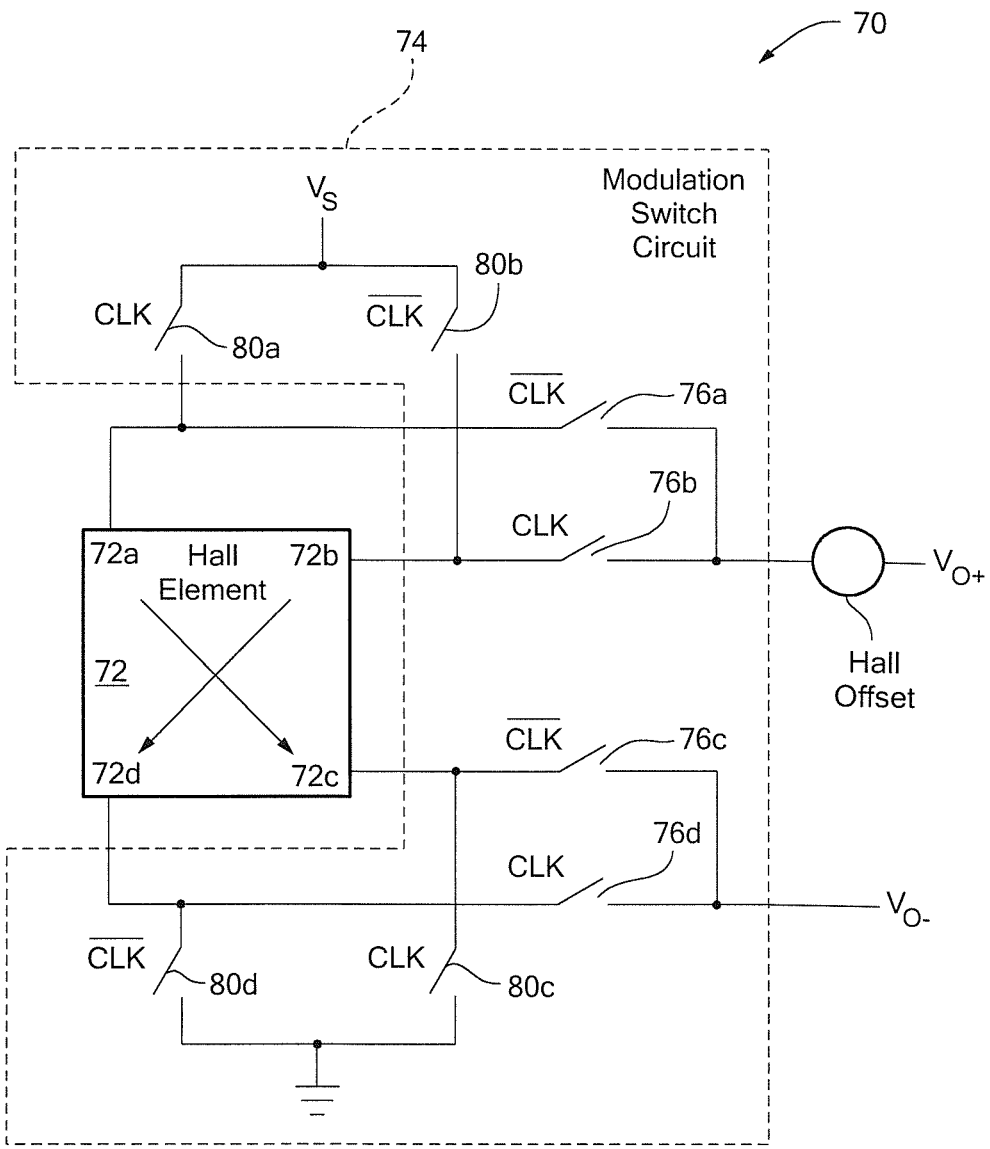
FIG. 3 is a block diagram showing a switched Hall element having a Hall effect element and having a switching circuit that can be used as the Hall effect element and the switching circuit in the sensor of FIG. 1, and also as the Hall effect element and the switching circuit of magnetic field sensors below.
Figure 3A:
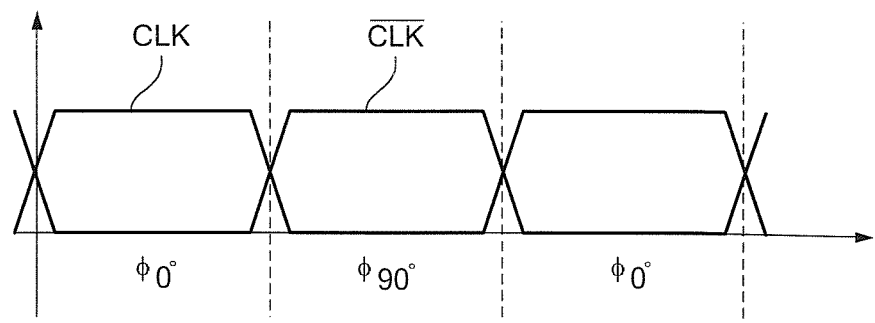
FIG. 3A is a graph showing clock signals for the switched Hall element of FIG. 3.

The chopping circuit 70 of FIG. 3 can be used as the combined switching circuits 12, 14 of FIG. 1.

Figure 3B:
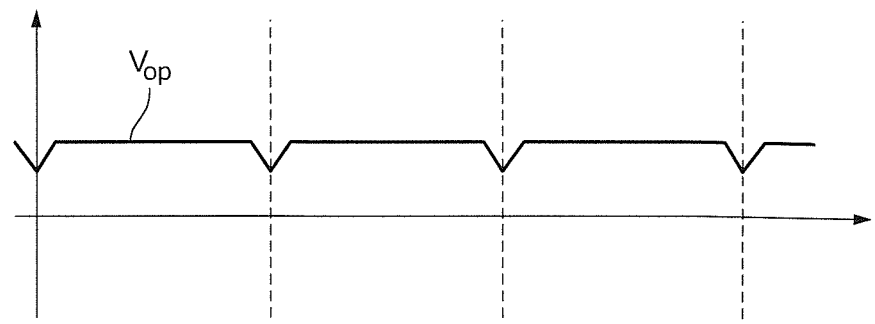
FIG. 3B is a graph showing an un-modulated offset component provided by the switched Hall element of FIG. 3.
Figure 3C:
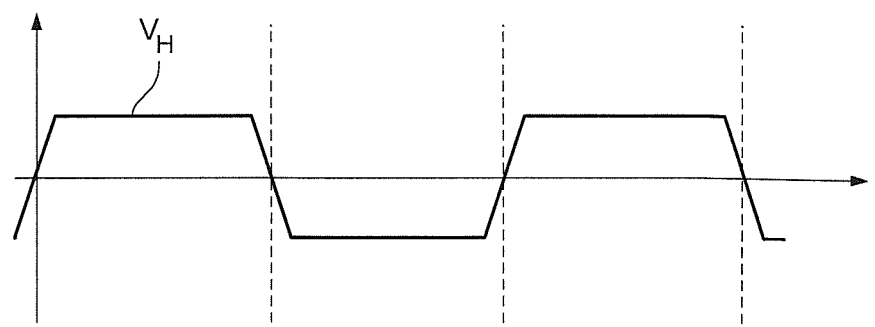
FIG. 3C is a graph showing a modulated magnetic field signal component provided by the switched Hall element of FIG. 3.

Referring now to FIGS. 3-3C, an alternative switched Hall element 70 of a type that modulates a magnetic field signal component (which can be used for the switching circuits 12, 14 of FIG. 1) includes a Hall element 72 and a modulation circuit 74. The Hall effect element 72 is the same as the Hall effect element 52 of FIG. 2 and includes four contacts 72a, 72b, 72c, and 72d, each coupled to a first terminal of a respective switch 76a, 76b, 76c, and 76d. Second terminals of switches 76a and 76b are coupled to provide a positive node of a switched Hall output signal, here labeled Vo+, and second terminals of switches 56c and 56d are coupled to provide a negative node of the switched Hall output signal, here labeled Vo−. Thus, a comparison of FIGS. 2 and 3 reveals that the output contacts of the Hall element are interchanged during the $\phi_{90°}$ phase.

Additional switches 80a, 80b, 80c, and 80d are arranged to selectively couple the Hall contacts 72a, 72b, 72c, and 72d to the supply voltage Vs and ground. Switches 76b, 76d, 80a, and 80c are controlled by clock signal, CLK, and switches 76a, 76c, 80b, and 80d are controlled by a complementary clock signal, CLK/, as shown. Clock signals, CLK and CLK/, are identical to like signals in FIG. 2 and thus have two states or phases, $\phi_{0°}$ and $\phi_{90°}$, as shown.

In operation, during phase $100_{0°}$, current flows from the terminal 72a to the terminal 72c, and the switched Hall output signal, Vo, is equal to $V_H+V_{op}$. During phase $100_{90°}$, current flows from the terminal 72b to the terminal 72d, and the switched Hall output signal, Vo, is equal to $-V_H+V_{op}$. Thus, the modulation circuit 74 modulates the magnetic signal component to provide a modulated magnetic signal component, $V_H$, which is shown in FIG. 3C. The offset component, $V_{op}$, remains substantially invariant as is shown in FIG. 3B.

It will be understood that the switches 80a-80d can form a switching circuit the same as or similar to the switching circuit 12 of FIG. 1. It will also be understood that the switches 76a-76d can form a switching circuit the same as or similar to the switching circuit 14 of FIG. 1

In some embodiments, the combination of the switching circuit 12 and the switching circuit 14 of FIG. 1 is of a type described above in conjunction with FIGS. 3-3C, rather than of a type described above in conjunction with FIGS. 2-2C.

Figure 4:
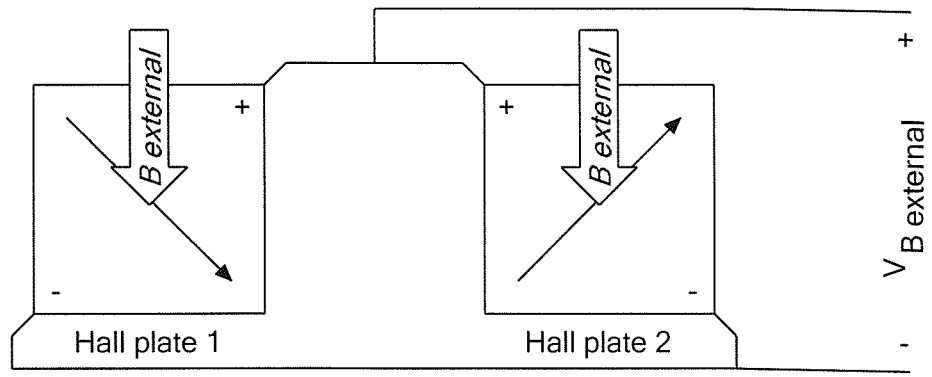
FIG. 4 is a block diagram showing two Hall effect elements arranged in parallel in a measured-field-sensing configuration, which would tend to respond in cooperation in the presence of an external magnetic field.

Referring now to FIG. 4, two Hall effect elements can be coupled together in parallel. The two Hall effect elements coupled in parallel can be used in place of any of the single Hall effect elements described above in conjunction with FIGS. 1-3C. Thus, the output (plus and minus) of the two parallel Hall effect elements can be used in place of a plus and minus output from one Hall effect element. Drive signals (not shown in FIG. 4) can drive the two parallel Hall effect elements just as they drive the one Hall effect element in any of the above figures.

The parallel arrangement of Hall effect elements is referred to herein as a measured-field-sensing configuration, as opposed to a reference-field-sensing configuration described more fully below.

Figure 5:
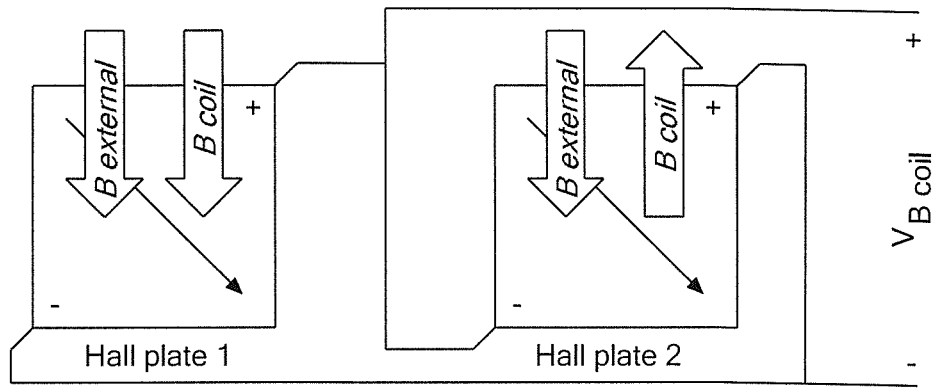
FIG. 5 is a block diagram showing the two Hall effect elements of FIG. 4, reconnected so as to be in a reference-field-sensing configuration, and in the presence of the external magnetic field of FIG. 4 and also in the presence of a two reference magnetic fields as may be generated in two opposite directions, e.g., by two respective coils.

Referring now to FIG. 5, the two Hall effect elements of FIG. 4 can be coupled together (i.e., re-connected) in a reference-field-sensing configuration. With this arrangement, it should be understood that the combination of the two Hall effect elements is substantially unresponsive to an external magnetic field, Bexternal, in the same direction as experienced by each one of the two Hall effect elements. A residual response to the external magnetic field can be due to a mismatch of the two Hall effect elements, which would result in a residual external magnetic field signal.

However, it will also be understood that, in response to two reference magnetic fields, Bcoil, in different directions as experienced by each one of the two Hall effect elements arranged in the reference-field-sensing configuration, the combination of the two magnetic field sensing elements does generate a non-zero output signal, $V_{Bcoil}$.

Figure 5A:
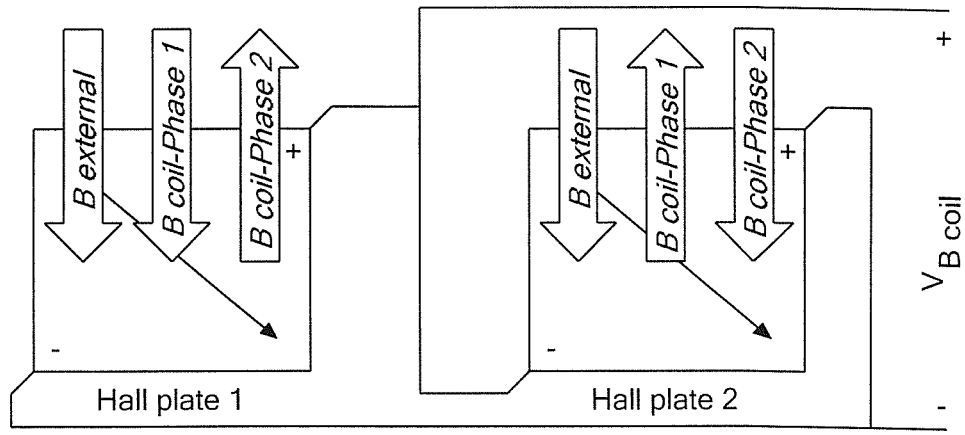
FIG. 5A is a block diagram showing the two Hall effect elements of FIG. 4, reconnected so as to be in the reference-field-sensing configuration, and in the presence of the external magnetic field of FIG. 5, and also in the presence of a two reference magnetic fields as may be generated in two opposite directions, e.g., by two respective coils, wherein the two reference magnetic fields are AC magnetic fields.

Referring now to FIG. 5A, the two Hall effect elements are again shown arranged in the reference-field-sensing configuration. Here, two phases (directions) of each of the two reference magnetic fields, Bcoil, are shown. In essence, in response to an AC reference magnetic field, the output signal, $V_{Bcoil}$, is an AC signal. However, when the two Hall effect elements are arranged in the reference-field-sensing configuration, the output signal has substantially zero contribution from the external magnetic field, which is in the same direction at both Hall effect elements, regardless of whether the external magnetic field is a DC magnetic field or an AC magnetic field.

Figure 6:
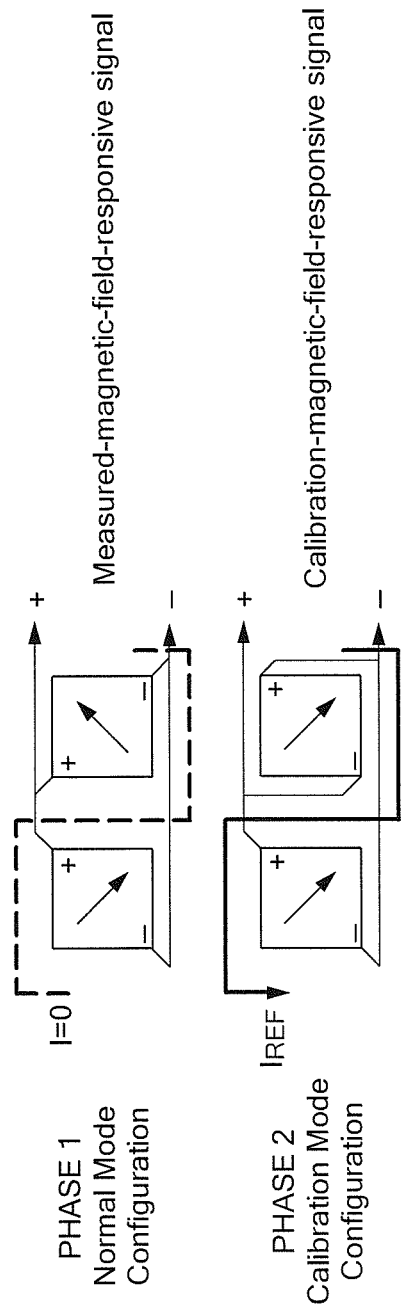
FIG. 6 is a block diagram showing two Hall elements for which couplings are alternated back and forth between the measured-field-sensing configuration and the reference-field-sensing configuration in two phases, and without chopping of the two Hall elements when in the measured-field-sensing configuration.

Referring now to FIG. 6, two magnetic field sensing elements, which are the same two magnetic field sensing elements, are shown in two different phase arrangements. The two different phase arrangements are achieved alternately by way of a switching circuit described more fully below in conjunction with FIG. 12.

As used herein, the word "phase" is used in many instances to describe both a coupling arrangement of two or more magnetic field sensing elements into the measured-field-sensing configuration or into the reference-field-sensing configuration and also a direction of a current passing through a reference field conductor, which is shown here to be a simple conductor, but which, in other arrangements described below, for example, in FIG, 12, can be comprised of two reference field coil portions. The word phase as used herein does not refer to a chopping arrangement, described more fully below.

Referring first to a phase 1 arrangement, the two magnetic field sensing elements are coupled in the measured-field-sensing configuration, which is the same as or similar to the coupling arrangement described above in conjunction with FIG. 4. As described above, with this coupling arrangement, the two magnetic field sensing elements are responsive to an external magnetic field as may be received from the environment and collectively generate a so-called "measured-magnetic-field-responsive signal."

A reference field conductor is shown as dashed line, the dashed line indicative of no current being carried by the reference field conductor. However, in an alternate embodiment, the reference field conductor can carry a current, IREF.

It will be recognized that a current carried by the reference field conductor generates a magnetic field around the reference field conductor. It will also be recognized that, due to the path of the reference field conductor, the magnetic field has a direction into the page at the right-hand magnetic field sensing element and out of the page at the left-hand magnetic field sensing element. Thus, two magnetic fields generated by the reference field conductor are in opposite directions at the two magnetic field sensing elements. Because the two magnetic field sensing elements are coupled in parallel in the measured-field-sensing configuration and both have the same direction of response, the output signal generated by the two magnetic field sensing elements in response to a current carried by the reference field conductor will be zero or near zero.

Thus, any current passing through the reference field conductor has little or no effect on an output signal generated collectively by the two magnetic field sensing elements when coupled in the measured-field-sensing configuration.

In contrast, in response to a measured magnetic field, as may be received from the environment, which passes through both of the Hall elements in the same direction, the measured-magnetic-field-responsive signal is not zero. Thus, when coupled in the phase 1 arrangement, the two magnetic field sensing elements are not responsive to a magnetic field generated by the reference field conductor, but are responsive to a measured (external or normal) magnetic field.

In a phase 2 arrangement, the two magnetic field sensing elements are coupled in the reference-field-sensing configuration, which is the same as or similar to the coupling arrangement described above in conjunction with FIGS. 5 and 5A. From discussion above, it will be understood that, when in the reference-field-sensing configuration, the two magnetic field sensing elements are responsive in opposite directions to magnetic fields perpendicular to the page.

In the phase 2 arrangement of the two magnetic field sensing elements, the reference field conductor, which is the same reference field conductor shown in this phase 1 arrangement, carries a current, IREF. As described above in the phase 1 arrangement, the current, IREF, generates magnetic fields at the two magnetic field sensing elements that are in opposite directions. Because the two magnetic field sensing elements in the reference-field-sensing configuration have opposite sensitivities to magnetic fields, in the presence of the current, IREF, a non-zero output signal, referred to herein as a "reference-magnetic-field-responsive signal" is generated by the two magnetic field sensing elements. Thus, when coupled in the phase 2 arrangement, the two magnetic field sensing elements are responsive to a magnetic field generated by the reference field conductor, but are not responsive to a measured (external or normal) magnetic field It will become apparent from discussion below that a magnetic field sensor can operate by alternating back and forth between the phase 1 and phase 2 arrangements. It should be apparent that, with this alternating arrangement, the measured-field-sensing configuration is always the same, and thus, there is no chopping of the two Hall elements. Chopping in the measured-field-sensing configuration is described more fully below in conjunction with FIGS. 7 and 10.

Taken together, since they are from the same two magnetic field sensing elements but taken at different times, the measured-magnetic-field-responsive signal and the reference-magnetic-field-responsive signal are referred to herein simply as a "magnetic field signal," which is responsive to magnetic fields From figures below it will become apparent that because couplings of the two magnetic field sensing elements, for example the two magnetic field sensing elements of FIG. 6, are alternated back and forth, the magnetic field signal has both the measured-magnetic-field-responsive signal portions responsive to a measured magnetic field when coupled in the measured-field-sensing configuration and a reference-magnetic-field-responsive signal portions responsive to a reference magnetic field when coupled in the reference-field-sensing configuration. As further described below, because the measured-field-sensing configuration and the reference-field-sensing configuration occur alternately back-and-forth, by using time division multiplexing, the measured-magnetic-field-responsive signal portions can be separated from the reference-magnetic-field-responsive signal portions in ways described more fully below.

Figure 7:
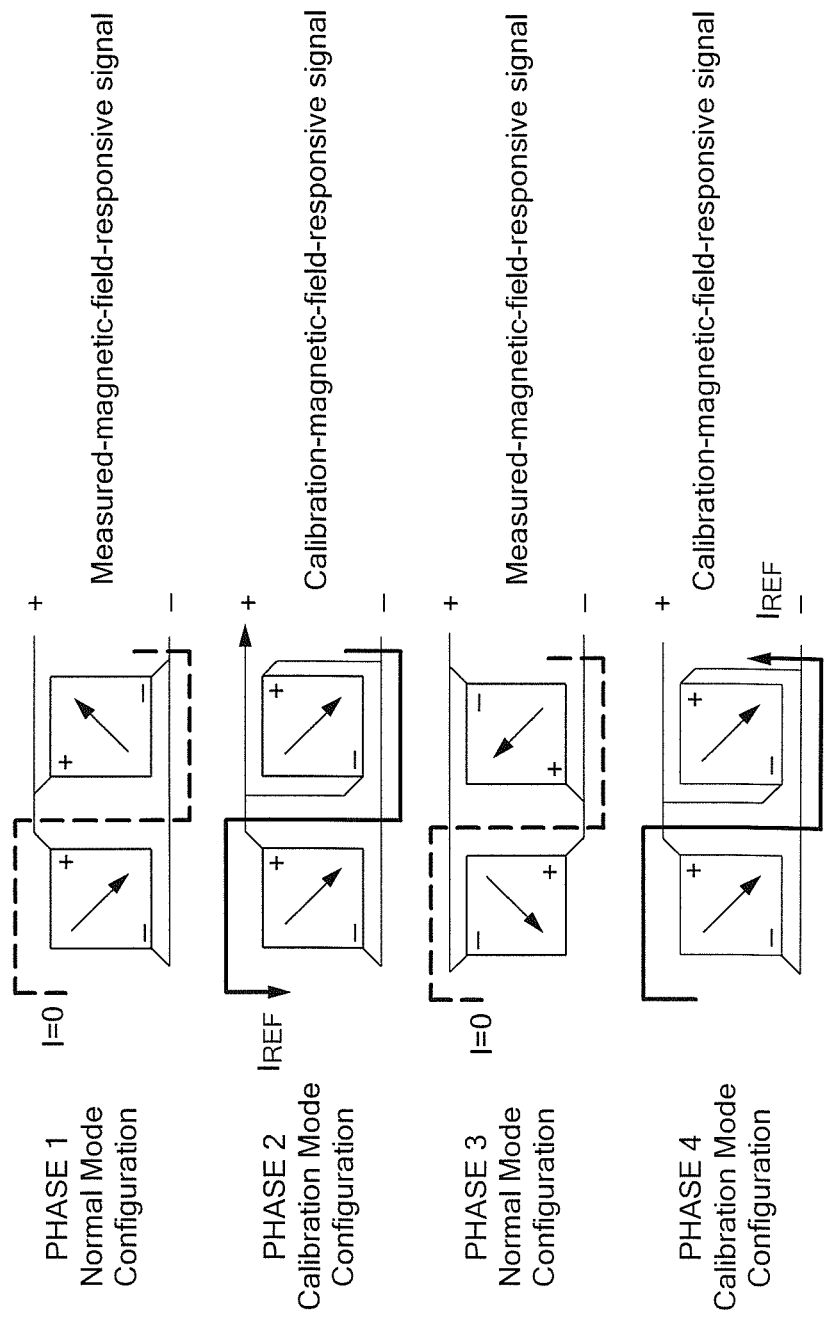
FIG. 7 is a block diagram showing two Hall elements for which couplings are alternated back and forth between two measured-field-sensing configurations and the reference-field-sensing configuration in four phases, wherein the two Hall elements are chopped to achieve two measured-field-sensing configurations.

Referring now to FIG. 7, two magnetic field sensing elements, which are the same two magnetic field sensing elements, are shown in four different phase arrangements, two in the measured-field-sensing configuration and two in the reference-field-sensing configuration (a 2× chopping arrangement associated with each configuration). The four different phase arrangements are achieved sequentially and repetitively by way of a switching circuit described more fully below in conjunction with FIG. 12.

Referring first to a phase 1 arrangement, the two magnetic field sensing elements are coupled in the measured-field-sensing configuration, which is the same as or similar to the measured-field-sensing-configuration coupling arrangement described above in conjunction with FIG. 4. As described above, with this coupling arrangement, the two magnetic field sensing elements are responsive to an external magnetic field as may be received from the environment and collectively generate the measured-magnetic-field-responsive signal, responsive to a measured (external) magnetic field.

A reference field conductor is shown as dashed line, the dashed line indicative of no current being carried by the reference field conductor. However, in an alternate embodiment, the reference field conductor can carry a current.

In a phase 2 arrangement, the two magnetic field sensing elements are coupled in the reference-field-sensing configuration, which is the same as or similar to the reference field coupling arrangement described above in conjunction with FIGS. 5 and 5A. From discussion above, it will be understood that the two magnetic field sensing elements are coupled in way such that the two magnetic field sensing elements are responsive in opposite directions to a magnetic field perpendicular to the page.

In the phase 2 arrangement of the two magnetic field sensing elements, the reference field conductor, which is the same reference field conductor shown in this phase 1 arrangement, carries a current, IREF. The current, IREF, generates magnetic fields at the two magnetic field sensing elements that are in opposite directions. Because the two magnetic field sensing elements in the reference-field-sensing configuration have opposite sensitivities to a magnetic field, in the presence of the current, IREF, a non-zero output signal, the reference-magnetic-field-responsive signal, is generated by the two magnetic field sensing elements. In the phase 2 arrangement, the two magnetic field sensing elements are responsive to the magnetic fields generated by the reference field conductor and or not responsive to the measured (external) magnetic field.

In a phase 3 arrangement, the two magnetic field sensing elements are again coupled in the measured-field-sensing configuration. However, the two magnetic field sensing elements are coupled so as to have a reverse polarity from that shown in the phase 1 arrangement. The reverse polarity is representative of the part of the above-described chopping of the two magnetic field sensing elements, described, for example, in conjunction with FIGS. 3-3C.

Different directions of arrows within the Hall elements are representative of different couplings of drive signals (not shown) to a selected two of the terminals of the individual Hall elements. Conventional Hall elements are four terminal devices, wherein two of the terminals are coupled to pass a drive current, and the remaining two terminals provide a differential output signal. It will be recognized that the four terminals can be coupled in at least four different configurations. If an individual Hall element is coupled into two or more of these different configurations and the output signals from the two or more different configurations are arithmetically processed (e.g., summed or otherwise averaged), arithmetically processed signal has less of an offset voltage than the output signal taken at any one of the different configurations. This summing or averaging of output signals associated with different configurations corresponds to the above-mentioned "chopping."

The arrangement of FIG. 7, in particular, the two measured-field-sensing configurations of phase 1 and phase 3, is representative of a 2× chopping of the two Hall elements. Essentially, the measure-magnetic-field-responsive signal portions, which occur at different times, can be arithmetically processed to reduce an offset voltage.

In the phase 3 arrangement of the two magnetic field sensing elements, the reference field conductor, which is the same reference field conductor shown in the phase 1 and phase 2 arrangements, carries no current. However, in an alternate embodiment, the reference field conductor can carry a current. The same as for the phase 1 arrangement, in the phase 3 arrangement, the two magnetic field sensing elements taken collectively are again not responsive to the magnetic field is generated by a current carried by a reference field conductor, but are responsive to an external magnetic field.

In a phase 4 arrangement, the two magnetic field sensing elements are again coupled in the reference-field-sensing configuration.

In the phase 4 arrangement of the two magnetic field sensing elements, the reference field conductor, which is again the same reference field conductor shown in the phase 1, phase 2, and phase 3 arrangements, carries the current, IREF, but in the opposite direction from that which is shown in the phase 2 arrangements. The same as for the phase 2 arrangement, in the phase 4 arrangement, the two magnetic field sensitive elements taken together are responsive to the magnetic fields generated by the current, IREF, and not responsive to an external magnetic field.

Taken together, since they are from the same two magnetic field sensing elements, the measured-magnetic-field-responsive signal and the reference-magnetic-field-responsive signal are referred to herein simply as a "magnetic field signal," which is responsive to magnetic fields From figures below it will become apparent that because couplings of the two magnetic field sensing elements, for example the two magnetic field sensing elements of FIG. 7, are alternated back and forth, the magnetic field signal has both the measured-magnetic-field-responsive signal portions responsive to a measured magnetic field when coupled in the measured-field-sensing configuration and a reference-magnetic-field-responsive signal portions responsive to a reference magnetic field when coupled in the reference-field-sensing configuration. Because the measured-field-sensing configuration and the reference-field-sensing configuration occur alternately back-and-forth, by using time division multiplexing, the measured-magnetic-field-responsive signal portion can be separated from the reference-magnetic-field-responsive signal portion in ways described more fully below.

Figure 8:
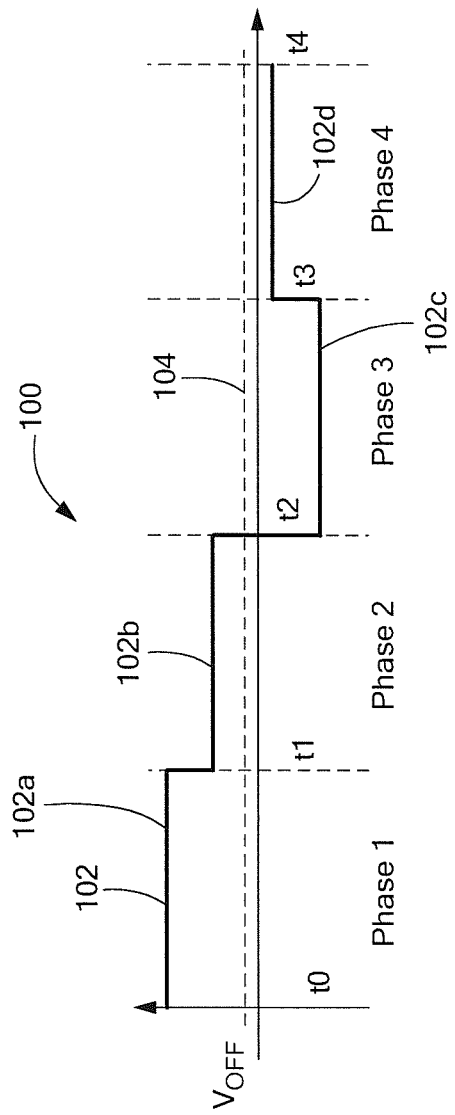
FIG. 8 is a graph showing output signals from the two Hall elements of FIG. 7 and showing the signals during all of the four phases.

Referring now to FIG. 8, the graph 100 includes a horizontal axis with a scale in arbitrary units of time and of vertical axis with a scale in arbitrary units of voltage. A magnetic field signal 102 is representative of a magnetic field signal as may be generated, for example, by the two magnetic field sensing elements described above in conjunction with FIG. 7 during the four phases.

The graph 100 shows four time periods t0-t1, t1-t2, t2-t3, t3-t4. Each one of the time periods t0-t1, t1-t2, t2-t3, t3-t4 corresponds to a respective one of phase 1, phase 2, phase 3, and phase 4 of FIG. 7. The magnetic field signal 102 includes a measured-magnetic-field-responsive signal portion 102*a*, a reference-magnetic-field-responsive signal portion 102*b*, a measured-magnetic-field-responsive signal portion 102*c*, and a reference-magnetic-field-responsive signal portion 102*d* as may be generated by the two magnetic field sensing elements of FIG. 7 as the two magnetic field sensing elements are sequenced through the four phases, phase 1, phase 2, phase 3, and phase 4.

The two measured-magnetic-field-responsive signal portions 102*a*, 102*c* have magnitudes representative of a magnitude of an external magnetic field as may be sensed by the two magnetic field sensing elements, first with a magnitude in one direction in phase 1 and then in the other direction in phase 3 due to the different coupling of drive signals.

The two reference-magnetic-field-responsive signal portions 102*b*, 102*d* have magnitudes representative of a magnitude of the reference magnetic field (having two reference magnetic field portions in opposite directions) as may be generated by the current, IREF, passing through the reference field conductor of FIG. 6, first in one direction in phase 2 and then in the other direction in phase 4.

The magnetic field signal 102 has an offset voltage 104. Thus, the two measured-magnetic-field-responsive signal portions 102a, 102c have magnitudes centered about the offset voltage 104. Similarly, the two reference-magnetic-field-responsive signal portions 102b, 102d have magnitudes centered about the offset voltage 104.

It should be understood that the offset voltage 104 is not desirable. By techniques described more fully below, the offset voltage 104 can be removed.

Referring now to FIG. 9, in which like elements of FIG. 8 are shown having like reference designations, a graph 120 has the same horizontal axis and the same vertical axis as those shown in conjunction with FIG. 8. Here however, only the two measured-magnetic-field-responsive signal portions 102a, 102c are shown as could be separated out from the magnetic field signal 102 of FIG. 8 by way of time division multiplexing.

Referring now to FIG. 10, in which like elements of FIG. 8 are shown having like reference designations, a graph 140 has the same horizontal axis and the same vertical axis as those shown in conjunction with FIG. 8. Here however, only the two reference-magnetic-field-responsive signal portions 102b, 102d are shown as could be separated out from the magnetic field signal 102 of FIG. 8 by way of time division multiplexing.

Figure 11:
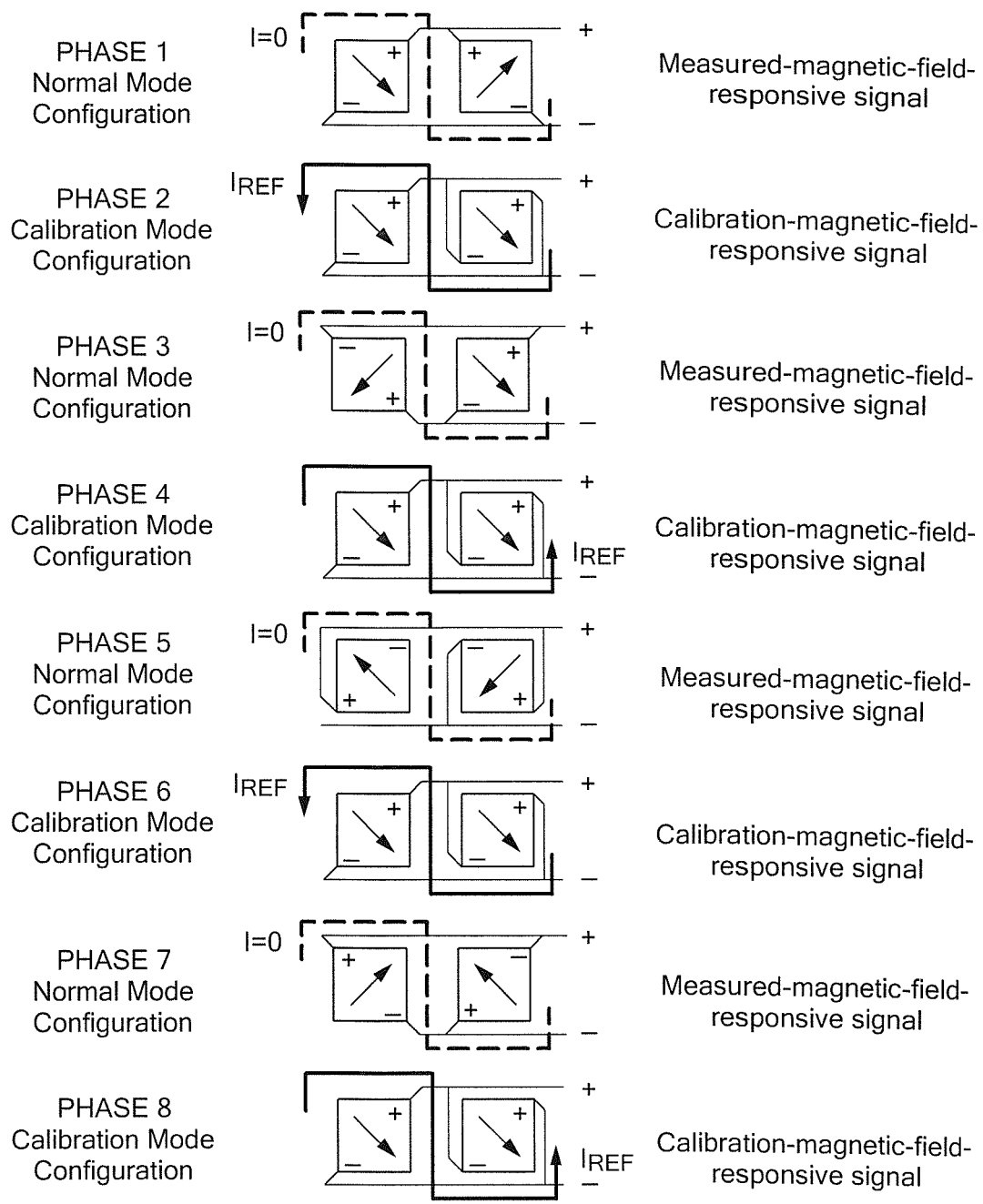
FIG. 11 is a block diagram showing two Hall elements for which couplings are alternated back and forth between four measured-field-sensing configurations and the reference-field-sensing configuration in eight phases, wherein the two Hall elements are chopped to achieve the four measured-field-sensing configurations.

Referring now to FIG. 11, two magnetic field sensing elements are again shown but here with eight different phases, i.e., couplings of the magnetic field sensing elements and directions of current through a conductor. As with the arrangements of FIGS. 6 and 7, phases phase 1, phase2, phase3, phase4, phase5, phase6, phase7, phase8 alternate back and forth between having the magnetic field sensing elements coupled in the measured-field-sensing configuration (i.e., during measurement time periods) and in the reference-field-sensing configuration (i.e., during reference time periods) (a 4× chopping arrangement associated with each configuration). Here it is shown that the current alternates in direction upon every other phase of the two magnetic field sensing elements.

Again, when in the measured-field-sensing configurations of phase 1, phase 3, phase 5, and phase 7, current through the conductor can be turned off, which is represented by dashed lines.

Measured-field-sensing configurations of phase 1, phase 3, phase 5, phase 7 each have a different couplings (.e., four different couplings) of drive signals (not shown) as represented by different directions of arrows within the two magnetic field sensing elements. In accordance with the four different couplings, it will be recognized that the arrangement shown FIG. 11 is a 4× chopping arrangement and output signals from these four different phases can be summed or otherwise averaged in order to achieve a reduced offset voltage when in the measured-field-sensing configurations.

Figure 12:
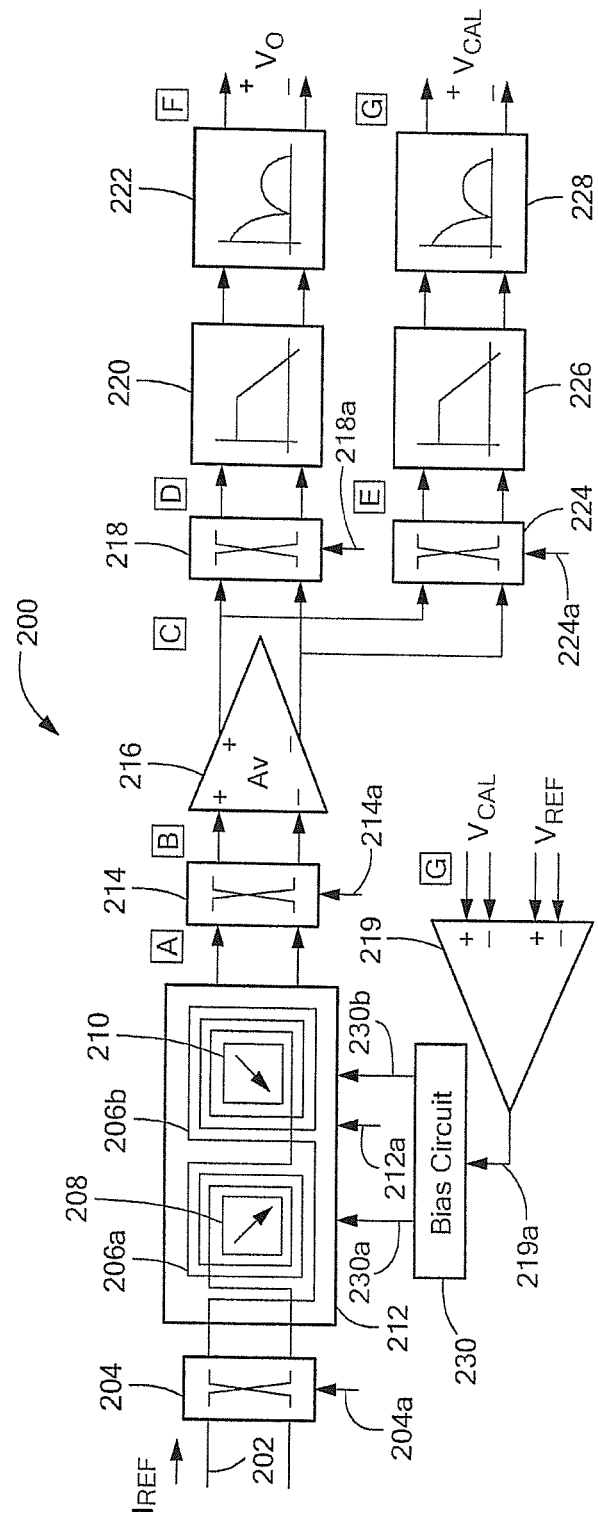
FIG. 12 is a block diagram showing a magnetic field sensor having two Hall elements, a corresponding two reference field conductors, here shown to be coils, and having two electronic channels, a first channel configured to generate an output signal responsive to a measured (normal) magnetic field, and a second channel configured to generate an output signal responsive to the reference magnetic field as generated by the two reference field conductors.

Referring now to FIG. 12, a magnetic field sensor 200 includes two reference field conductors 206a, 206b here shown the form of conductive reference field coils, each reference field coil wound in an opposite direction from the other so as to generate, in response to the current flowing through the two reference field coils, magnetic fields in opposite directions. The two reference field conductors 206a, 206b are coupled in series and coupled to receive a current 202 by way of a switching circuit 204. In response to a control signal 204a, the switching circuit 204 is operable to periodically reverse a direction of the current 202 passing through the two reference field conductors 206a, 206b.

The magnetic field sensor 200 also includes two magnetic field sensing elements 208, 210, here shown in the form of two Hall elements. The two magnetic field sensing elements 206, 208 are coupled in a switching circuit 212. While two Hall elements 208, 210 are shown, in other embodiments, similar circuits and functionality could be achieved with two or more magnetoresistance elements, In response to a control signal 212a, the switching circuit 212 is operable to couple the two magnetic field sensing elements 208, 210 back and forth into the measured-field-sensing configuration and into the reference-field-sensing configuration shown above in conjunction with FIGS. 6, 7, and 11. The switching back and forth can have no chopping when in the measured-field-sensing-configuration as represented in FIG. 6, a 2× chopping when in the measured-field-sensing configuration as represented in FIG. 7, a 4× chopping when in the measured-field-sensing configuration as represented in FIG. 11, or other chopping arrangements.

A magnetic field signal, which can be a differential magnetic field signal, is identified by reference designator A. As described above, the magnetic field signal, A, can include both a measured-magnetic-field-responsive signal portion responsive to a measured magnetic field (and not responsive to a reference magnetic field) when coupled in the measured-field-sensing configuration, and a reference-magnetic-field-responsive signal portion responsive to the reference magnetic field (and not responsive to the measured magnetic field) when coupled in the reference-field-sensing configuration. The two signal portions can occur periodically and alternately, for example, as described above in conjunction with FIG. 6, 7, or 11.

A switching circuit 214 is coupled to receive the differential signal, i.e., the magnetic field signal, A, and configured to generate a switched signal, shown to be a differential signal, identified by reference designator B. It should be understood that the switching circuit 214 in combination with the switching circuit 212 provides the full chopping of the two Hall elements 208, 210, and the switching circuits 214, 212 are comparable to the switches 80a-80d and 76a-76d, respectively, of FIG. 3. However, unlike the arrangement of FIGS. 3-3C, which shows 2× chopping, the switching circuits 212, 214 of FIG. 12 are representative of 4× chopping as shown, for example, in FIG. 11.

The switching circuit 214 is coupled to receive a control signal 214a. An amplifier 216 is coupled to receive the switched signal, B, and is configured to generate an amplified signal, shown to be at differential signal, identified by reference designator C.

In part of a first circuit channel, i.e., a measured-field-sensing channel, a switching circuit 218 is coupled to receive the differential signal, C, and configured to generate a switched signal, shown to be a differential signal, identified by reference designator D.

In a further part of the first circuit channel, a filter circuit 220 is coupled to receive the differential signal, D, and configured to generate a filtered signal received by another filter circuit 222. The filter circuit 222 can be configured to generate an output signal, shown to be a differential signal, identified by reference designator F. The output signal, F, can be the above-described measured-magnetic-field-responsive signal.

In part of a second circuit channel, i.e., a reference-field-sensing channel, a switching circuit 224 is coupled to receive the differential signal, C, and configured to generate a switched signal, shown to be a differential signal, identified by reference designator E.

In a further part of the second circuit channel, a filter circuit 226 is coupled to receive the differential signal, E, and configured to generate a filtered signal received by another filter circuit 228. The filter circuit 228 can be configured to generate an output signal, shown to be a differential signal, identified by reference designator G. The output signal G can be the above-described reference-magnetic-field-responsive signal.

The output signals F and G, i.e., the measured-magnetic-field-responsive signal portion and the reference-magnetic-field-responsive signal portion, can occur back and forth repetitively and periodically.

The magnetic field sensor 200 can also include an amplifier 219 coupled to receive the output signal, G, i.e., the reference-magnetic-field-responsive signal, coupled to receive a reference signal, VREF, and configured to generate an error signal 219a. A bias circuit can be coupled to receive the error signal 219a and configured to generate bias signals 230a, 230b, which, in some embodiments, can be current signals, configured to drive and pass through two terminals of each respective one of the two Hall elements 208, 210 by way of the switching circuit 212.

In operation, the error signal 219a controls a magnitude of the bias signals 230a. 230b. An output signal, G, that is too large relative to the reference signal, VREF, results in a reduction of the bias signals 230a, 230b. Thus, an effective gain or sensitivity of the magnetic field sensor 200 is controlled in relation to the reference voltage, VREF.

In some alternate embodiments, the error signal 219a instead controls a gain of the amplifier 216.

In some other alternate embodiments, the amplifier 219 is not used, and instead the output signal, G, is received by and used by another processor (not shown) to adjust a magnitude of a signal related to the output signal, F.

Figure 13:
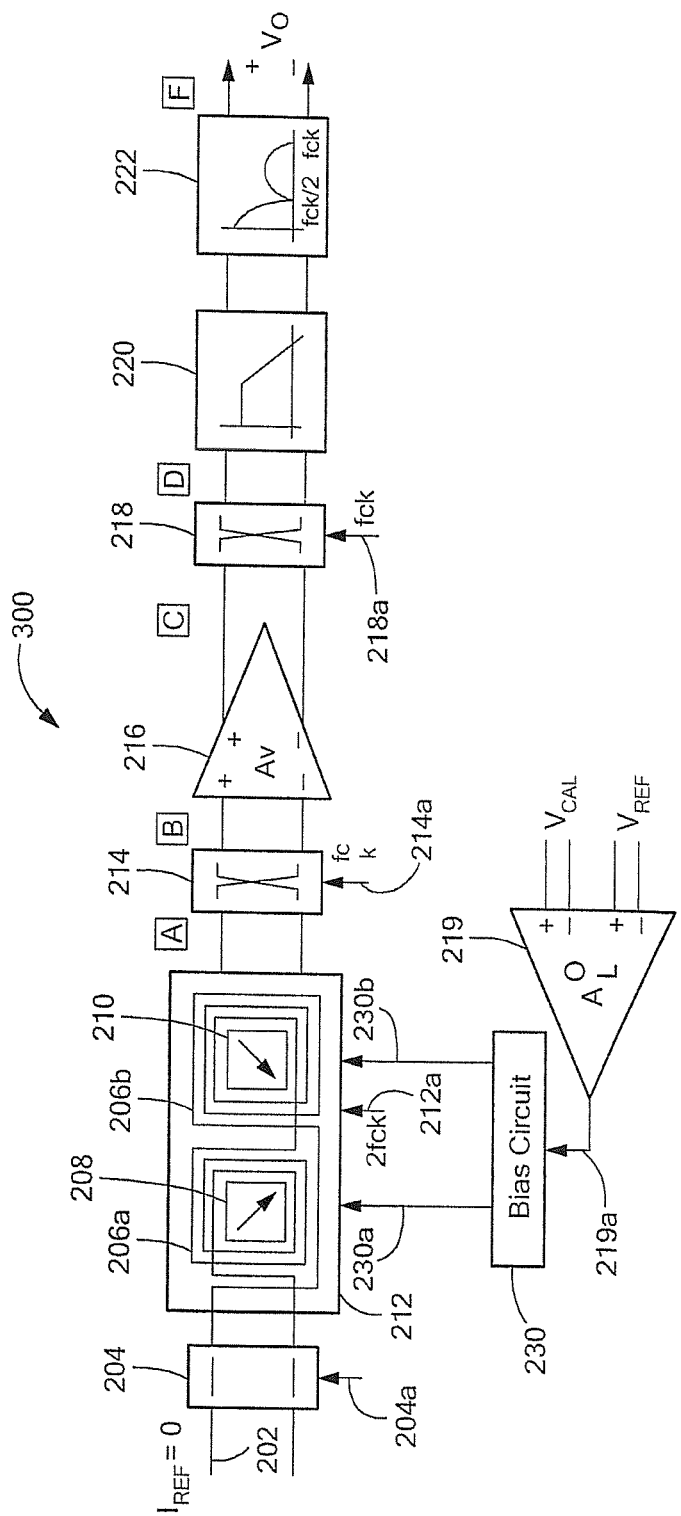
FIG. 13 is a block diagram showing a portion of the magnetic field sensor of FIG. 12, and, in particular, showing the first channel and not showing the second channel of FIG. 12.

Further operation of the magnetic field sensor 200 is described below in conjunction with FIGS. 13-24. In particular, FIG. 13 shows the magnetic field sensor 200 of FIG. 12 when the two magnetic field sensing elements 208, 210 are coupled repetitively and periodically in the measured-field-sensing configuration. Similarly, FIG. 19 shows the magnetic field sensor 200 of FIG. 12 when the two magnetic field sensing elements 208, 210 are coupled repetitively and periodically, for example, in the reference-field-sensing configuration of FIG. 7.

Referring now to FIG. 13, in which like elements of FIG. 12 are shown having like reference designations, a portion 300 of the magnetic field sensor 200 of FIG. 12 but having only the first channel, which generates the measured-magnetic-field-responsive signal, F, is shown.

When the two magnetic field sensing elements 208, 210 are coupled in the measured-field-sensing configuration repetitively and periodically, the switching circuit 204 can be coupled into any configuration. Here is shown that the switching circuit 204 does not switch, meaning that the switching circuit 204 is a pass-through each time that the two magnetic field sensing elements 208, 210 are coupled into the measured-field-sensing configuration by the switching circuit 212.

Also, when in the measured-field-sensing configuration, the current 202 through the two reference field coils 206a, 206b can be set to zero. It will be understood from discussion above that, when the two magnetic field sensing elements 208, 210 are coupled in the measured-field-sensing configuration, taken together they are responsive to magnetic fields in the same direction and not to magnetic fields as would be generated in opposite directions by the two reference field coils 206a, 206b. Thus the current 202 can be set to zero in order to conserve power.

The switching circuit 214 is shown by way of the switching symbol inside of the switching circuit 214 to be switching, meaning, that upon each occurrence of the measured-field-sensing configuration coupling of the two magnetic field sensing elements 208, 210 by the switching circuit 212, the switching circuit 214 reverses couplings between the two magnetic field sensing elements 208, 210 and the amplifier 216. This results in a frequency shift of components of the magnetic fields signal, A, further described below.

The switching circuit 218 is also shown by way of the switching symbol inside of the switching circuit 218 to be switching, again meaning, that upon each occurrence of the measured-magnetic-field-configuration couplings of the two magnetic field sensing elements 208, 210 by the switching circuit 212, the switching circuit 218 reverses couplings between amplifier 216 and the filter circuit 220. This also results in another frequency shift of components of the amplified signal, C, as further described below.

As indicated, the control signals 214a, 218a switch the respective switching circuits 214, 218 with a switching rate of fck. In contrast, the switching circuit 212 switches with the switching rate of 2fck, meaning that the switching circuit 212 achieves the measured-field-sensing configuration of the two magnetic field sensing elements 208, 210 on every other clock cycle of the control signal 212a.

FIGS. 14-18 show frequency domain graphs of the signals, A, B, C, D, and F, that occur within the portion 300 of the magnetic field sensor 200 with the two magnetic field sensing elements 208, 210 coupled repetitively and periodically in the normal configuration mode of operation. In particular, FIGS. 14-18 are representative of the 4x chopping of FIG. 11 for the measured-field-sensing configuration mode of operation.

Figure 14:
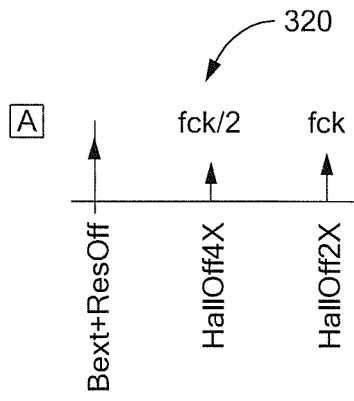
FIGS. 14-18 are graphs showing frequency spectra at various points of the magnetic field sensor portion of FIG. 13.

Referring now to FIG. 14, a graph 320 has a horizontal axis with a scale in arbitrary units of frequency and a vertical axis with a scale in arbitrary units of magnitude. The graph 320 includes three spectral lines when in the presence of a stationary, i.e. non-varying, magnetic field. The magnetic field is a sensed or external magnetic field.

The graph 320 is representative of the magnetic field signal, A, associated with the magnetic field sensor portion 300 of FIG. 13, i.e. the magnetic field signal, A, taken when the magnetic field sensing elements 208, 210 are repetitively and periodically coupled in the measured-field-sensing configuration.

A first spectral line (left) occurs at DC and has a magnitude corresponding to a magnitude, Bext, of the external, or sensed, magnetic field plus an undesirable residual offset voltage (after chopping) generated by the two magnetic field sensing elements 208, 210 of FIG. 13.

A second spectral line occurs at a frequency of fck/2 and results from the 4x chopping described above.

A third spectral line occurs at a frequency of fck and also results from the 4x chopping described above.

Figure 15:
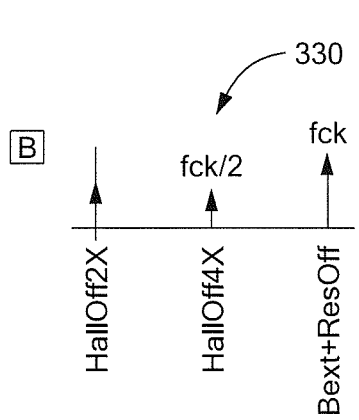

Referring now to FIG. 15, a graph 330 has a horizontal axis with a scale in arbitrary units of frequency and a vertical axis with a scale in arbitrary units of magnitude. The graph 330 includes three spectral lines when in the presence of a stationary, i.e. non-varying, magnetic field. The magnetic field is a sensed or external magnetic field.

The graph 330 is representative of the magnetic field signal, B, associated with the magnetic field sensor portion 300 of FIG. 13 taken when the magnetic field sensing elements 208, 210 are repetitively and periodically coupled in the measured-field-sensing configuration.

As can be seen, by operation of the switching circuit 214 of FIGS. 12 and 13, frequencies have been shifted.

A first spectral line (left) occurs at DC and has a magnitude related to the magnitude of the third spectral line of FIG. 14.

A second spectral line occurs at a frequency of fck/2 and has a magnitude related to the magnitude of the second spectral line of FIG. 14.

A third spectral line occurs at a frequency of fck and has a magnitude related to the magnitude of the first spectral line of FIG. 14, corresponding to the magnitude, Bext, of the external, or sensed, magnetic field plus the undesirable residual offset voltage (after chopping) generated by the two magnetic field sensing elements 208, 210 of FIG. 13.

Figure 16:
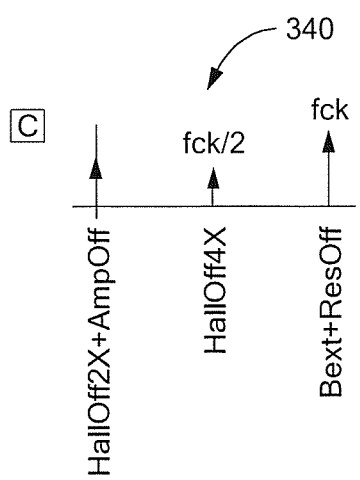

Referring now to FIG. 16, a graph 340 has a horizontal axis with a scale in arbitrary units of frequency and a vertical axis with a scale in arbitrary units of magnitude. The graph 340 includes three spectral lines when in the presence of a stationary, i.e. non-varying, magnetic field. The magnetic field is a sensed or external magnetic field.

The graph 340 is representative of the magnetic field signal, C, associated with the magnetic field sensor portion 300 of FIG. 13 taken when the magnetic field sensing elements 208, 210 are repetitively and periodically coupled in the measured-field-sensing configuration.

As can be seen, the amplifier 216 adds an offset component, AmpOff, to the first spectral line of FIG. 15 appearing at DC. Otherwise, the three spectral lines of FIG. 16 are the same as those of FIG. 15, but scaled according to a gain of the amplifier 216.

Figure 17:
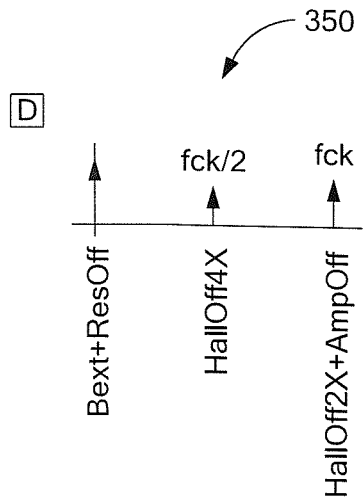

Referring now to FIG. 17, a graph 350 has a horizontal axis with a scale in arbitrary units of frequency and a vertical axis with a scale in arbitrary units of magnitude. The graph 350 includes three spectral lines when in the presence of a stationary, i.e. non-varying, magnetic field. The magnetic field is a sensed or external magnetic field.

The graph 350 is representative of the magnetic field signal, D, associated with the magnetic field sensor portion 300 of FIG. 13 taken when the magnetic field sensing elements 208, 210 are repetitively and periodically coupled in the measured-field-sensing configuration.

As can be seen, by operation of the switching circuit 218 of FIGS. 12 and 13, frequencies have been shifted.

A first spectral line (left) occurs at DC and has a magnitude related to the magnitude of the third spectral line of FIG. 16, corresponding to the magnitude, Bext, of the external, or sensed, magnetic field plus the undesirable residual offset voltage (after chopping) generated by the two magnetic field sensing elements 208, 210 of FIG. 13.

A second spectral line occurs at a frequency of fck/2 and has a magnitude related to the magnitude of the second spectral line of FIG. 16.

A third spectral line occurs at a frequency of fck and has a magnitude related to the magnitude of the first spectral line of FIG. 16.

Figure 18:
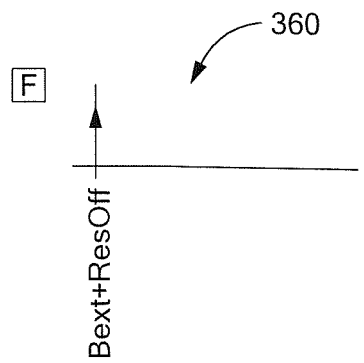
Figure 19:
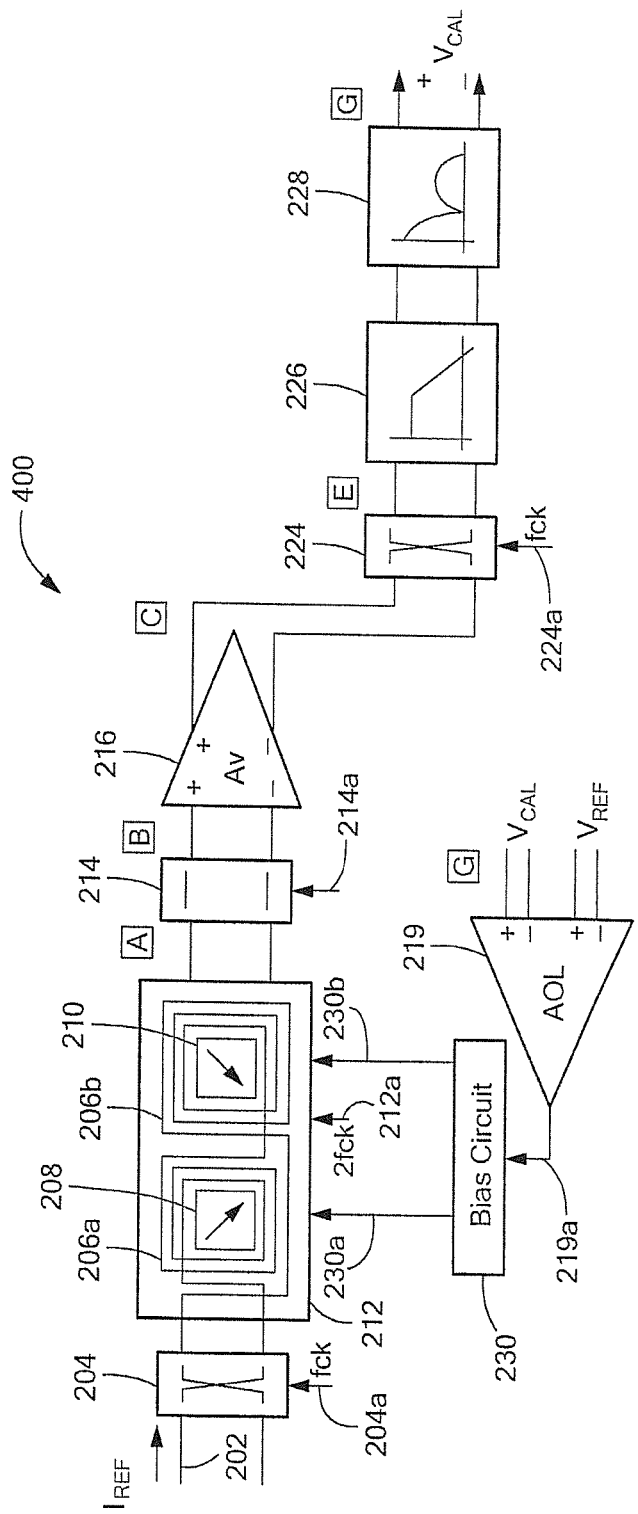
FIG. 19 is a block diagram showing another portion of the magnetic field sensor of FIG. 12, and, in particular, showing the second channel and not showing the first channel of FIG. 12.

Referring now to FIG. 18, a graph 360 has a horizontal axis with a scale in arbitrary units of frequency and a vertical axis with a scale in arbitrary units of magnitude. The graph 360 includes one spectral line when in the presence of a stationary, i.e. non-varying, magnetic field. The magnetic field is a sensed or external magnetic field.

The graph 360 is representative of the magnetic field signal, F, associated with the magnetic field sensor portion 300 of FIG. 13 taken when the two magnetic field sensing elements 208, 210 are repetitively and periodically coupled in the measured-field-sensing configuration.

As can be seen, by operation of the filter circuits 220, 222 of FIGS. 12 and 13, some spectral components of FIG. 17 have been removed, leaving only the a spectral line at DC having a magnitude corresponding to the magnitude, Bext, of the external, or sensed, magnetic field plus the undesirable residual offset voltage, ResOff, (after chopping) generated by the two magnetic field sensing elements 208, 210 of FIG. 13. The spectral line of FIG. 18 is representative of the above-described measured-magnetic-field-responsive signal.

Referring now to FIG. 19, in which like elements of FIG. 12 are shown having like reference designations, a portion 400 of the magnetic field sensor 200 of FIG. 12 but having only the second channel, which generates the reference-magnetic-field-responsive signal, G, includes elements shown.

When the two magnetic field sensing elements 208, 210 are coupled in the reference-field-sensing configuration repetitively and periodically, the switching circuit 204 switches to reverse a direction of the current 202 each time that the two magnetic field sensing elements 208, 210 are coupled into the reference-field-sensing configuration by the switching circuit 212.

When in the reference-field-sensing configuration, the current 202 through the two reference field coils 206a, 206b can be set to the value of IREF. It will be understood from discussion above that when the two magnetic field sensing elements 208, 210 coupled in the reference-field-sensing configuration, taken together they are responsive to magnetic fields in opposite directions as would be generated in opposite directions by the two reference field coils 206a, 206b, and not to a magnetic field in the same direction as would be an external or sensed magnetic field.

The switching circuit 214 is shown to not be switching, meaning, that upon each occurrence of the reference-field-sensing configuration coupling of the two magnetic field sensing elements 208, 210 by the switching circuit 212, the switching circuit 214 merely passes the magnetic field signal, A, to the amplifier 216 as the signal, B, without switching, This results in no frequency shift of components of the magnetic fields signal, A, further described below.

In contrast, the switching circuit 224 is shown by way of the switching symbol inside of the switching circuit 224 to be switching, meaning, that upon each occurrence of the reference-field-sensing configuration couplings of the two magnetic field sensing elements 208, 210 by the switching circuit 212, the switching circuit 218 reverses couplings between amplifier 216 and the filter circuit 226. This results in a frequency shift of components of the amplified signal, C, as further described below.

As indicated, the control signals 204a, 224a switch the respective switching circuits 204, 224 with a switching rate of fck. In contrast, the switching circuit 212 switches with the switching rate of 2fck, meaning that the switching circuit 212 achieves the reference-field-sensing configuration of the two magnetic field sensing elements 208, 210 on every other clock cycle of the control signal 212a, and the measured-field-sensing configuration on other ones of the clock cycles.

FIGS. 20-24 show frequency domain graphs of the signals, A, B, C, E, and G, that occur within the portion 400 of the magnetic field sensor 200 with the two magnetic field sensing elements 208, 210 coupled repetitively and periodically in the reference-field-sensing configuration mode of operation. In particular, FIGS. 20-24 are representative of the 4× chopping of FIG. 11 for the reference-field-sensing configuration mode of operation.

Figure 20:
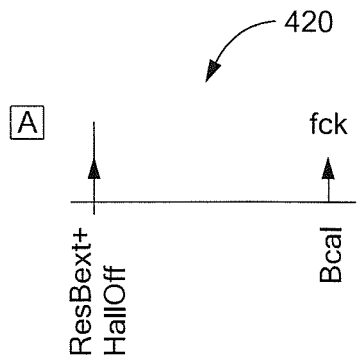
FIGS. 20-24 are graphs showing frequency spectra at various points of the magnetic field sensor portion of FIG. 19.

Referring now to FIG. 20, a graph 420 has a horizontal axis with a scale in arbitrary units of frequency and a vertical axis with a scale in arbitrary units of magnitude. The graph 420 includes two spectral lines when in the presence of a periodically reversing reference magnetic field generated by the periodic reversal of the current 202 by operation of the switching circuit 204.

The graph 420 is representative of the magnetic field signal, A, associated with the magnetic field sensor portion 400 of FIG. 19, i.e. the magnetic field signal, A, taken when the magnetic field sensing elements 208, 210 are repetitively and periodically coupled in the reference-field-sensing configuration.

A first spectral line (left) occurs at DC and has a magnitude corresponding to a magnitude of a residual sensitivity to the external or sensed magnetic field, ResBext, plus an undesirable offset voltage (no chopping) generated by the two magnetic field sensing elements 208, 210 of FIG. 19.

A second spectral line occurs at a frequency of fck and has a magnitude, Bcal, corresponding to a magnitude of the reference magnetic field generated by the two reference field coils 206a, 206b. This spectral line has already been shifted to the frequency fck by operation of the switching of the switching circuit 204.

Figure 21:
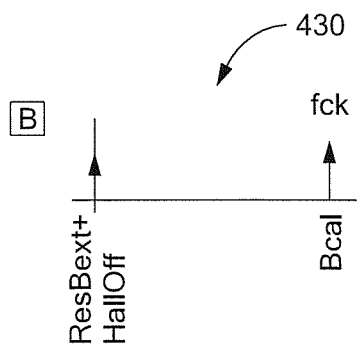

Referring now to FIG. 21, a graph 430 has a horizontal axis with a scale in arbitrary units of frequency and a vertical axis with a scale in arbitrary units of magnitude. The graph 430 includes two spectral lines when in the presence of the periodically reversing reference magnetic field generated by the periodic reversal of the current 202 by operation of the switching circuit 204.

The graph 430 is representative of the magnetic field signal, B, associated with the magnetic field sensor portion 400 of FIG. 19 taken when the magnetic field sensing elements 208, 210 are repetitively and periodically coupled in the reference-field-sensing configuration.

Since the switching circuit 214 of FIGS. 12 and 19 merely acts as a pass through when the two magnetic field sensing elements 208, 210 are coupled in the reference-field-sensing configuration, the graph 430 has the same spectral lines as the graph 420 of FIG. 20.

Figure 22:
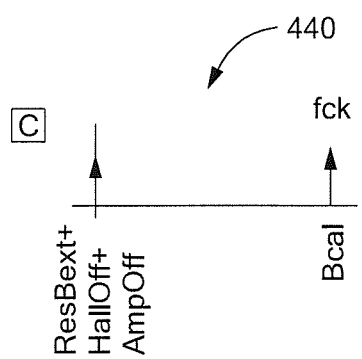

Referring now to FIG. 22, a graph 440 has a horizontal axis with a scale in arbitrary units of frequency and a vertical axis with a scale in arbitrary units of magnitude. The graph 440 includes two spectral lines when in the presence of a periodically reversing reference magnetic field generated by the periodic reversal of the current 202 by operation of the switching circuit 204.

The graph 440 is representative of the magnetic field signal, C, associated with the magnetic field sensor portion 400 of FIG. 19 taken when the magnetic field sensing elements 208, 210 are repetitively and periodically coupled in the reference-field-sensing configuration.

As can be seen, the amplifier 216 adds an offset component, AmpOff, to the spectral line of FIG. 21 appearing at DC. Otherwise, the two spectral lines of FIG. 22 are the same as those of FIG. 21, but scaled according to a gain of the amplifier 216.

Figure 23:
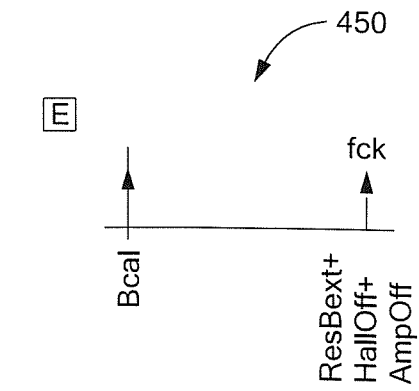

Referring now to FIG. 23, a graph 450 has a horizontal axis with a scale in arbitrary units of frequency and a vertical axis with a scale in arbitrary units of magnitude. The graph 450 includes two spectral lines when in the presence of a periodically reversing reference magnetic field generated by the periodic reversal of the current 202 by operation of the switching circuit 204.

The graph 450 is representative of the magnetic field signal, E, associated with the magnetic field sensor portion 400 of FIG. 19 taken when the magnetic field sensing elements 208, 210 are repetitively and periodically coupled in the reference-field-sensing configuration.

As can be seen, by operation of the switching circuit 224 of FIGS. 12 and 19, frequencies have been shifted.

A first spectral line (left) occurs at DC and has a magnitude, Bcal, related to the magnitude of the second spectral line of FIG. 22 and corresponding to the magnitude of the reference magnetic field generated by the two reference field coils 206a, 206b. This spectral line is shifted to DC by operation of the switching circuit 224.

A second spectral line occurs at a frequency of fck and has a magnitude related to the magnitude of the first, DC, spectral line of FIG. 22.

Figure 24:
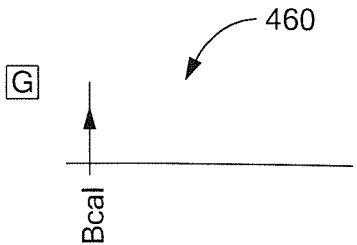

Referring now to FIG. 24, a graph 460 has a horizontal axis with a scale in arbitrary units of frequency and a vertical axis with a scale in arbitrary units of magnitude. The graph 460 includes one spectral line.

The graph 460 is representative of the magnetic field signal, G, associated with the magnetic field sensor portion 400 of FIG. 19 taken when the magnetic field sensing elements 208, 210 are repetitively and periodically coupled in the reference-field-sensing configuration.

As can be seen, by operation of the filter circuits 226, 228 of FIGS. 12 and 19, other spectral components of FIG. 23 have been removed, leaving only the a spectral line at DC having a magnitude corresponding to the magnitude, Bcal, of the reference magnetic field. The spectral line of FIG. 23 is representative of the above-described reference-magnetic-field-responsive signal.

While circuits and techniques may be described herein in terms of calibration of the magnetic field sensor, it should be understood that the same techniques can be used to provide a self-test of the magnetic field sensor. Namely, the reference-magnetic-field-responsive signal portion, G, of FIGS. 12 and 19 can be examined, for example, by another processor, to identify if the signal is within acceptable limits.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor, comprising:
   at least two magnetic field sensing elements;
   a first switching circuit coupled to the at least two magnetic field sensing elements, wherein the first switching circuit is configured to couple the at least two magnetic field sensing elements into a measured-field-sensing configuration and into a reference-field-sensing configuration, wherein the first switching circuit is configured to couple the at least two magnetic field sensing elements in parallel so as to respond in cooperation in the presence of an external magnetic field when coupled in the measured-field-sensing configuration, and to couple the at least two magnetic field sensing elements such that the responses to the external magnetic field oppose one another when coupled in the reference-field-sensing configuration, and wherein the first switching circuit is operable to switch back and forth alternately between the measured-field-sensing configuration and the reference-field-sensing configuration at a first switching rate to provide a magnetic field signal, wherein the first switching circuit is configured to generate the magnetic field signal comprising:
      a measured-magnetic-field-responsive signal portion responsive to the external magnetic field when coupled in the measured-field-sensing configuration; and a reference-magnetic-field-responsive signal portion responsive to a reference magnetic field when coupled in the reference-field-sensing configuration;

a processing circuit coupled to receive the magnetic field signal; and a feedback circuit coupled to receive a signal representative of the magnetic field signal from the processing circuit and configured to generate a feedback signal to control at least one of a bias signal applied to drive the at least two magnetic field sensing elements or a gain of the processing circuit.

2. The magnetic field sensor of claim 1, wherein the reference magnetic field comprises first and second reference magnetic fields pointing in opposite directions at locations of selected ones of the at least two magnetic field sensing elements, the magnetic field sensor further comprising:

a magnetic field generator operable to generate the first and second reference magnetic fields.

3. The magnetic field sensor of claim 2, wherein the magnetic field generator comprises:

at least two reference field conductor portions proximate to the at least two magnetic field sensing elements, respectively, wherein the at least two reference field conductor portions are configured to carry a reference current to generate the reference magnetic field.

4. The magnetic field sensor of claim 3, further comprising:

a second switching circuit coupled to provide the reference current, wherein the second switching circuit is operable to alternately switch the reference current between a first reference current direction and a second opposite reference current direction synchronously with the first switching rate.

5. The magnetic field sensor of claim 3, wherein the processing circuit is coupled to receive the magnetic field signal from the first switching circuit, wherein the magnetic field signal, during first time periods, is representative of the measured-magnetic-field-responsive signal portion and, during second different time periods interleaved with the first time periods at a rate synchronous with the first switching rate, is representative of the reference-magnetic-field-responsive signal portion, wherein the processing circuit comprise:

a first processing channel time multiplexed to select and to process the signal representative of the measured-magnetic-field-responsive signal portion during the first time periods to generate a first sensor output signal representative of the measured-magnetic-field-responsive signal portion; and a second different processing channel time multiplexed to select and to process the signal representative of the reference-magnetic-field-responsive signal portion during the second different time periods to generate a second different sensor output signal representative of the reference-magnetic-field-responsive signal portion.

6. The magnetic field sensor of claim 5, wherein the feedback circuit is coupled to receive a signal representative of the second sensor output signal.

7. The magnetic field sensor of claim 5, wherein the measured-field-sensing configuration comprises at least two different alternating measured-field-sensing configurations representative of a chopping of the at least two magnetic field sensing elements.

8. The magnetic field sensor of claim 5, wherein the at least two magnetic field sensing elements are supported by a substrate, and wherein the at least two reference field conductor portions comprise a conductor separate from but proximate to the substrate.

9. The magnetic field sensor of claim 5, wherein the external magnetic field is generated by a measured current carried by a measured-current conductor.

10. The magnetic field sensor of claim 5, wherein the at least two magnetic field sensing elements comprise at least two Hall effect elements.

11. The magnetic field sensor of claim 5, wherein the at least two magnetic field sensing elements comprise at least two magnetoresistance elements.

12. The magnetic field sensor of claim 5, wherein the at least two magnetic field sensing elements are supported by a substrate, and wherein the at least two reference field conductor portions comprise a conductor supported by the substrate and proximate to the magnetic field sensing element.

13. The magnetic field sensor of claim 12, wherein the at least two reference field conductor portions span more than one metal layer supported by the substrate.

14. A method of generating a calibration or a self-test of a magnetic field sensor, comprising:

coupling at least two magnetic field sensing elements into a measured-field-sensing configuration, wherein the coupling the at least two magnetic field sensing elements into the measured-field-sensing comprises coupling the at least two magnetic field sensing elements in parallel so as to respond in cooperation in the presence of an external field, coupling the at least two magnetic field sensing elements into a reference-field-sensing configuration, wherein the coupling that at least two magnetic field sensing elements into the reference-field-sensing configuration comprises coupling the at least two magnetic field sensing elements such that their responses to the external magnetic field oppose one another, switching back and forth alternately between the measured-field-sensing configuration and the reference-field-sensing configuration at a first switching rate to provide a magnetic field signal, wherein the switching is configured to generate the magnetic field signal comprising:

a measured-magnetic-field-responsive signal portion responsive to the external magnetic field when coupled in the measured-field-sensing configuration; and a reference-magnetic-field-responsive signal portion responsive to a reference magnetic field when coupled in the reference-field-sensing configuration; and using a signal representative of the magnetic field signal as feedback signal to control at least one of a bias signal applied to drive that at least two magnetic field sensing elements or a gain of a processing circuit coupled to the at least two magnetic field sensing elements.

15. The method of claim 14, wherein the reference magnetic field comprises first and second reference magnetic fields pointing in opposite directions at locations of selected ones of the at least two magnetic field sensing elements.

16. The method of claim 14, further comprising:

generating a reference current to generate the reference magnetic field, wherein the reference magnetic field comprises at least two reference magnetic field portions having respective magnetic field directions directed in opposite directions.

17. The method of claim 16, further comprising;

switching alternately between a first reference current direction and a second opposite reference current direction synchronously with the first switching rate.

18. The method of claim 16, further comprising:
receiving the magnetic field signal from the first switching circuit, wherein the magnetic field signal, during first time periods, is representative of the measured-magnetic-field-responsive signal portion and, during second different time periods interleaved with the first time periods at a rate synchronous with the first switching rate, is representative of the reference-magnetic-field-responsive signal portion;
time multiplexing to select and to process the signal representative of the measured-magnetic-field-responsive signal portion during the first time periods to generate a first sensor output signal representative of the measured-magnetic-field-responsive signal portion; and
time multiplexing to select and to process the signal representative of the reference-magnetic-field-responsive signal portion during the second different time periods to generate a second different sensor output signal representative of the reference-magnetic-field-responsive signal portion.

19. The method of claim 18, further comprising:
using a signal representative of the second sensor output signal as the feedback signal.

20. The method of claim 18, wherein the measured-field-sensing configuration comprises at least two different alternating measured-field-sensing configurations representative of a chopping of the at least two magnetic field sensing elements.

21. The method of claim 18, wherein the at least two magnetic field sensing elements are supported by a substrate, wherein the at least two reference magnetic field portions are generated by at least two reference field conductor portions comprising a conductor separate from but proximate to the substrate.

22. The method of claim 18, wherein the external magnetic field is generated by a measured current carried by a measured-current conductor.

23. The method of claim 18, wherein the at least two magnetic field sensing elements comprise at least two Hall effect elements.

24. The method of claim 18, wherein the at least two magnetic field sensing elements comprise at least two magnetoresistance elements.

25. The method of claim 18, wherein the at least two magnetic field sensing elements are supported by a substrate, and wherein the at least two reference magnetic field portions are generated by at least two reference field conductor portions comprising a conductor supported by the substrate and proximate to the at least two magnetic field sensing elements.

26. The method of claim 25, wherein the at least two reference field conductor portions span more than one metal layer supported by the substrate.

27. A magnetic field sensor, comprising:
at least two magnetic field sensing elements; and
a first switching circuit coupled to the at least two magnetic field sensing elements, wherein the first switching circuit is configured to couple the at least two magnetic field sensing elements into a measured-field-sensing configuration and into a reference-field-sensing configuration, wherein the first switching circuit is operable to switch back and forth alternately between the measured-field-sensing configuration and the reference-field-sensing configuration at a first switching rate to provide a magnetic field signal, wherein the first switching circuit is configured to generate the magnetic field signal comprising:
a measured-magnetic-field-responsive signal portion responsive to an external magnetic field when coupled in the measured-field-sensing configuration; and
a reference-magnetic-field-responsive signal portion responsive to a reference magnetic field when coupled in the reference-field-sensing configuration, wherein the reference magnetic field comprises first and second reference magnetic fields pointing in opposite directions at locations of selected ones of the at least two magnetic field sensing elements, wherein the magnetic field sensor further comprises:
a magnetic field generator operable to generate the first and second reference magnetic fields, wherein the magnetic field generator comprises:
at least two reference field conductor portions proximate to the at least two magnetic field sensing elements, respectively, wherein the at least two reference field conductor portions are configured to carry a reference current to generate the reference magnetic field, wherein the reference magnetic field comprises at least two reference magnetic field portions having respective magnetic field directions directed in opposite directions, wherein the magnetic field sensor further comprises:
a second switching circuit coupled to provide the reference current, wherein the second switching circuit is operable to alternately switch the reference current between a first reference current direction and a second opposite reference current direction synchronously with the first switching rate.

28. The magnetic field sensor of claim 27, wherein the first switching circuit is configured to couple the at least two magnetic field sensing elements to have respective opposite directions of responses to a magnetic field when coupled in the reference-field-sensing configuration.

29. The magnetic field sensor of claim 27, further comprising a feedback circuit configured to generate a feedback signal to control at least one of a bias signal applied to drive the at least two magnetic field sensing elements or a gain of the first and second processing channels.

30. The magnetic field sensor of claim 27, wherein the measured-field-sensing configuration comprises at least two different alternating measured-field-sensing configurations representative of a chopping of the at least two magnetic field sensing elements.

31. The magnetic field sensor of claim 27, wherein the at least two magnetic field sensing elements are supported by a substrate, and wherein the at least two reference field conductor portions comprise a conductor supported by the substrate and proximate to the magnetic field sensing element.

32. The magnetic field sensor of claim 27, wherein the external magnetic field is generated by a measured current carried by a measured-current conductor.

33. The magnetic field sensor of claim 27, wherein the at least two magnetic field sensing elements comprise at least two Hall effect elements.

34. The magnetic field sensor of claim 27, wherein the at least two magnetic field sensing elements comprise at least two magnetoresistance elements.

35. A magnetic field sensor, comprising:
at least two magnetic field sensing elements; and
a first switching circuit coupled to the at least two magnetic field sensing elements, wherein the first switching circuit is configured to couple the at least two magnetic field sensing elements into a measured-field-sensing configuration and into a reference-field-sensing configuration, wherein the first switching circuit is operable to switch back and forth alternately between the measured-field-sensing configuration and the reference-field-sensing configuration at a first switching rate to provide a magnetic field signal, wherein the first switching circuit is configured to generate the magnetic field signal comprising:
- a measured-magnetic-field-responsive signal portion responsive to an external magnetic field when coupled in the measured-field-sensing configuration; and
- a reference-magnetic-field-responsive signal portion responsive to a reference magnetic field when coupled in the reference-field-sensing configuration, wherein the reference magnetic field comprises first and second reference magnetic fields pointing in opposite directions at locations of selected ones of the at least two magnetic field sensing elements, wherein the magnetic field sensor further comprises:

a magnetic field generator operable to generate the first and second reference magnetic fields, wherein the magnetic field generator comprises:
- at least two reference field conductor portions proximate to the at least two magnetic field sensing elements, respectively, wherein the at least two reference field conductor portions are configured to carry a reference current to generate the reference magnetic field, wherein the reference magnetic field comprises at least two reference magnetic field portions having respective magnetic field directions directed in opposite directions, wherein the magnetic field sensor further comprises:

a processing circuit coupled to receive the magnetic field signal from the first switching circuit, wherein the magnetic field signal, during first time periods, is representative of the measured-magnetic-field-responsive signal portion and, during second different time periods interleaved with the first time periods at a rate synchronous with the first switching rate, is representative of the reference-magnetic-field-responsive signal portion, wherein the processing circuit comprises:
- a first processing channel time multiplexed to select and to process the signal representative of the measured-magnetic-field-responsive signal portion during the first time periods to generate a first sensor output signal representative of the measured-magnetic-field-responsive signal portion; and
- a second different processing channel time multiplexed to select and to process the signal representative of the reference-magnetic-field-responsive signal portion during the second different time periods to generate a second different sensor output signal representative of the reference-magnetic-field-responsive signal portion.

36. The magnetic field sensor of claim 35, wherein the first switching circuit is configured to couple the at least two magnetic field sensing elements to have respective opposite directions of responses to a magnetic field when coupled in the reference-field-sensing configuration.

37. The magnetic field sensor of claim 35, further comprising a feedback circuit configured to generate a feedback signal to control at least one of a bias signal applied to drive the at least two magnetic field sensing elements or a gain of the first and second processing channels.

38. The magnetic field sensor of claim 35, wherein the measured-field-sensing configuration comprises at least two different alternating measured-field-sensing configurations representative of a chopping of the at least two magnetic field sensing elements.

39. The magnetic field sensor of claim 35, wherein the at least two magnetic field sensing elements are supported by a substrate, and wherein the at least two reference field conductor portions comprise a conductor supported by the substrate and proximate to the magnetic field sensing element.

40. The magnetic field sensor of claim 35, wherein the external magnetic field is generated by a measured current carried by a measured-current conductor.

41. The magnetic field sensor of claim 35, wherein the at least two magnetic field sensing elements comprise at least two Hall effect elements.

42. The magnetic field sensor of claim 35, wherein the at least two magnetic field sensing elements comprise at least two magnetoresistance elements.

43. A method of generating a calibration or a self-test of a magnetic field sensor, comprising:
- coupling at least two magnetic field sensing elements into a measured-field-sensing configuration,
- coupling the at least two magnetic field sensing elements into a reference-field-sensing configuration, and
- switching back and forth alternately between the measured-field-sensing configuration and the reference-field-sensing configuration at a first switching rate to provide a magnetic field signal, wherein the switching is configured to generate the magnetic field signal comprising:
  - a measured-magnetic-field-responsive signal portion responsive to an external magnetic field when coupled in the measured-field-sensing configuration; and
  - a reference-magnetic-field-responsive signal portion responsive to a reference magnetic field when coupled in the reference-field-sensing configuration, wherein the method further comprises:
- generating a reference current to generate the reference magnetic field, wherein the reference magnetic field comprises at least two reference magnetic field portions having respective magnetic field directions directed in opposite directions; and
- switching alternately between a first reference current direction and a second opposite reference current direction synchronously with the first switching rate.

44. The method of claim 43, wherein the coupling the at least two magnetic field sensing elements into the reference-field-sensing configuration comprises coupling the at least two magnetic field sensing elements to have respective opposite directions of responses to a magnetic field When coupled in the reference-field-sensing configuration.

45. The method of claim 43, further comprising:
- generating a feedback signal to control at least one of a bias signal applied to drive the at least two magnetic field sensing elements or a gain of the first and second processing channels.

46. The method of claim 43, wherein the measured-field-sensing configuration comprises at least two different alternating measured-field-sensing configurations representative of a chopping of the at least two magnetic field sensing elements.

47. The method of claim 43, wherein the at least two magnetic field sensing elements are supported by a substrate, and wherein the at least two reference magnetic field portions are generated by at least two reference field conductor portions comprising a conductor supported by the substrate and proximate to the at least two magnetic field sensing elements.

48. The method of claim 43, wherein the external magnetic field is generated by a measured current carried by a measured-current conductor.

49. The method of claim 43, wherein the at least two magnetic field sensing elements comprise at least two Hall effect elements.

50. The method of claim 43, wherein the at least two magnetic field sensing elements comprise at least two magnetoresistance elements.

51. A method of generating a calibration or a self-test of a magnetic field sensor, comprising:
coupling at least two magnetic field sensing elements into a measured-field-sensing configuration,
coupling the at least two magnetic field sensing elements into a reference-field-sensing configuration, and
switching back and forth alternately between the measured-field-sensing configuration and the reference-field-sensing configuration at a first switching rate to provide a magnetic field signal, wherein the switching is configured to generate the magnetic field signal comprising:
a measured-magnetic-field-responsive signal portion responsive to an external magnetic field when coupled in the measured-field-sensing configuration; and
a reference-magnetic-field-responsive signal portion responsive to a reference magnetic field when coupled in the reference-field-sensing configuration, wherein the method further comprises;
generating a reference current to generate the reference magnetic field, wherein the reference magnetic field comprises at least two reference magnetic field portions having respective magnetic field directions directed in opposite directions;
receiving the magnetic field signal from the first switching circuit, wherein the magnetic field signal, during first time periods, is representative of the measured-magnetic-field-responsive signal portion and, during second different time periods interleaved with the first time periods at a rate synchronous with the first switching rate, is representative of the reference-magnetic-field-responsive signal portion;
time multiplexing to select and to process the signal representative of the measured-magnetic-field-responsive signal portion during the first time periods to generate a first sensor output signal representative of the measured-magnetic-field-responsive signal portion; and
time multiplexing to select and to process the signal representative of the reference-magnetic-field-responsive signal portion during the second different time periods to generate a second different sensor output signal representative of the reference-magnetic-field-responsive signal portion.

52. The method of claim 51, wherein the coupling the at least two magnetic field sensing elements into the reference-field-sensing configuration comprises coupling the at least two magnetic field sensing elements to have respective opposite directions of responses to a magnetic field when coupled in the reference-field-sensing configuration.

53. The method of claim 51, further comprising:
generating a feedback signal to control at least one of a bias signal applied to drive the at least two magnetic field sensing elements or a gain of the first and second processing channels.

54. The method of claim 51, wherein the measured-field-sensing configuration comprises at least two different alternating measured-field-sensing configurations representative of a chopping of the at least two magnetic field sensing elements.

55. The method of claim 51, wherein the at least two magnetic field sensing elements are supported by a substrate, and wherein the at least two reference magnetic field portions are generated by at least two reference field conductor portions comprising a conductor supported by the substrate and proximate to the at least two magnetic field sensing elements.

56. The method of claim 51, wherein the external magnetic field is generated by a measured current carried by a measured-current conductor.

57. The method of claim 51, wherein the at least two magnetic field sensing elements comprise at least two Hall effect elements.

58. The method of claim 51, wherein the at least two magnetic field sensing elements comprise at least two magnetoresistance elements.

59. A magnetic field sensor, comprising:
at least two magnetic field sensing elements;
a first switching circuit coupled to the at least two magnetic field sensing elements, wherein the first switching circuit is configured to couple the at least two magnetic field sensing elements into a measured-field-sensing configuration and into a reference-field-sensing configuration, wherein the first switching circuit is operable to switch back and forth alternately between the measured-field-sensing configuration and the reference-field-sensing configuration at a first switching rate to provide a magnetic field signal, wherein the first switching circuit is configured to generate the magnetic field signal comprising:
a measured-magnetic-field-responsive signal portion responsive to an external magnetic field when coupled in the measured-field-sensing configuration; and
a reference-magnetic-field-responsive signal portion responsive to a reference magnetic field when coupled in the reference-field-sensing configuration, wherein the reference magnetic field comprises first and second reference magnetic fields pointing in opposite directions at locations of selected ones of the at least two magnetic field sensing elements;
a processing circuit coupled to receive the magnetic field signal;
a feedback circuit coupled to receive a signal representative of the magnetic field signal from the processing circuit and configured to generate a feedback signal to control at least one of a bias signal applied to drive the at least two magnetic field sensing elements or a gain of the processing circuit; and
a magnetic field generator operable to generate the first and second reference magnetic fields.

60. The magnetic field sensor of claim 59, wherein the magnetic field generator comprises:
at least two reference field conductor portions proximate to the at least two magnetic field sensing elements, respectively, wherein the at least two reference field conductor portions are configured to carry a reference current to generate the reference magnetic field.

61. A method of generating a calibration or a self-test of a magnetic field sensor, comprising:
coupling at least two magnetic field sensing elements into a measured-field-sensing configuration,
coupling the at least two magnetic field sensing elements into a reference-field-sensing configuration,
switching back and forth alternately between the measured-field-sensing configuration and the reference-field-sensing configuration at a first switching rate to provide a magnetic field signal, wherein the switching is configured to generate the magnetic field signal comprising:

- a measured-magnetic-field-responsive signal portion responsive to an external magnetic field when coupled in the measured-field-sensing configuration; and
- a reference-magnetic-field-responsive signal portion responsive to a reference magnetic field when coupled in the reference-field-sensing configuration, wherein the reference magnetic field comprises first and second reference magnetic fields pointing in opposite directions at locations of selected ones of the at least two magnetic field sensing elements; and using a signal representative of the magnetic field signal as feedback signal to control at least one of a bias signal applied to drive the at least two magnetic field sensing elements or a gain of a processing circuit coupled to the at least two magnetic field sensing elements.

62. The method of claim 61, further comprising:

generating a reference current to generate the reference magnetic field.

\* \* \* \* \*